United States Patent [19]
Srinivasan et al.

[11] Patent Number: 5,964,857
[45] Date of Patent: Oct. 12, 1999

[54] PRIORITY ENCODER FOR A CONTENT ADDRESSABLE MEMORY SYSTEM

[75] Inventors: Varadarajan Srinivasan, Los Altos Hills; Ketan K. Mehta; Sanjay V. Gala, both of Sunnyvale; Ruchir P. Shah, Mountain View, all of Calif.

[73] Assignee: Quality Semiconductor, Inc., Santa Clara, Calif.

[21] Appl. No.: 08/865,819

[22] Filed: May 30, 1997

[51] Int. Cl.$^6$ .............................. G06F 13/42; G06F 12/00
[52] U.S. Cl. .......................... 710/126; 395/435; 395/478
[58] Field of Search .................................. 395/435, 478, 395/306; 365/208

[56] References Cited

U.S. PATENT DOCUMENTS

| | | | |
|---|---|---|---|
| 4,334,288 | 6/1982 | Booher | 364/900 |
| 4,348,741 | 9/1982 | McAlister et al. | 364/900 |
| 4,887,084 | 12/1989 | Yamaguchi | 341/160 |
| 4,928,260 | 5/1990 | Chuang et al. | 365/49 |
| 5,053,991 | 10/1991 | Burrows | 365/49 |
| 5,123,105 | 6/1992 | Wyland et al. | 395/725 |
| 5,394,353 | 2/1995 | Nusinov et al. | 365/49 |
| 5,440,715 | 8/1995 | Wyland | 395/435 |
| 5,467,319 | 11/1995 | Nusinov et al. | 365/231 |
| 5,555,397 | 9/1996 | Sasama et al. | 395/485 |
| 5,726,942 | 3/1998 | Yoneda et al. | 365/208 |

OTHER PUBLICATIONS

Mano, M. Morris, "Digital Design", Second Edition, Prentice Hall, pp. 170–173, 1984.

Primary Examiner—Ayaz R. Sheikh
Assistant Examiner—Jigar Pancholi
Attorney, Agent, or Firm—Pennie & Edmonds

[57] ABSTRACT

A priority encoder for generating a priority-encoded address which identifies the highest priority request line. According to one priority scheme, the active request line having the lowest address has the highest priority. The priority encoder is capable of generating the priority-encoded address by determining information corresponding to the most significant bits of the priority-encoded address and using this information in the computation of less significant bits of the priority-encoded address. Using purely combinatorial logic, including switch elements, the priority encoder is capable of computing lower order bits using feedback signals resulting from the computation of higher order bits, allowing successive computation of priority-encoded address bits, without necessitating the use of clocks or delay elements.

22 Claims, 24 Drawing Sheets

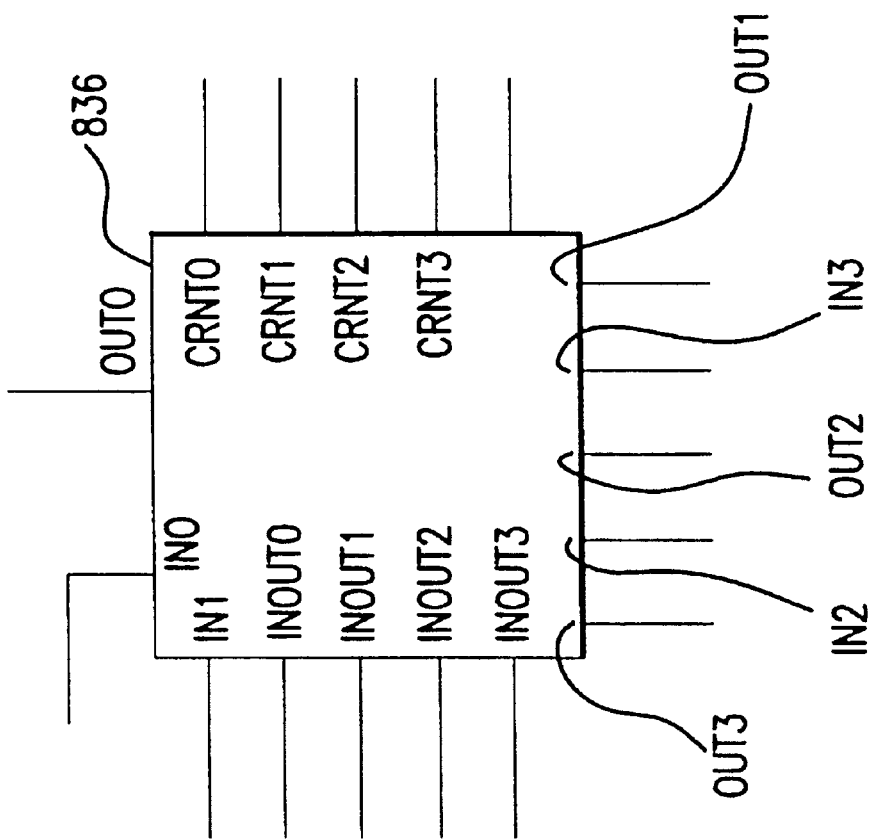

PRIORITY ENCODER FOR A CONTENT ADDRESSABLE MEMORY SYSTEM

CROSS-REFERENCE TO RELATED APPLICATIONS

The subject matter of this application is related to the subject matter of U.S. patent application Ser. No. 08/729,626, entitled "Content Addressable Memory and Random Access Memory Partition Circuit," filed Oct. 10, 1996, and U.S. patent application Ser. No. 08/858,997, entitled "Content Addressable Memory Multiple Match Detection Circuit," filed , May 20, 1997, now U.S. Pat. No. 5,852,569 both of which are assigned to the assignee of the present invention. The above applications are hereby incorporated by reference into the present application.

FIELD OF THE INVENTION

The present invention relates to the field of content addressable memories. In particular, the preferred embodiment relates to an apparatus for encoding match line addresses in a content addressable memory according to a priority scheme.

BACKGROUND OF THE INVENTION

A content addressable memory ("CAM") is a memory device in which data is accessed and modified based upon the content of the stored data, rather than on the location in which that data is stored. A CAM generally includes multiple data storage locations comprising multiple memory cells. Unlike random access memory ("RAM"), all data words in the storage locations of a CAM may be simultaneously compared with a search word stored in a comparand register. As each stored data word is compared with the search word, a match line for that stored data word is activated if that stored data word matches the search word.

A CAM of $2^N$ data words has $2^N$ match lines, one match line for each data word. Each data word and match line combination has a unique N-bit address within the CAM. For any match cycle there may be zero, one, or up to $2^N$ match lines activated. The function of a priority encoder is to generate an output address responsive to the state of the match lines. In particular, a priority encoder generates an output address corresponding to the address of the highest priority activated match line. Typically, a simple sequential priority scheme is used, the lowest address having the highest priority and the highest address having the lowest priority. In general, priority encoders may be used in both CAM and non-CAM applications, for providing a priority-encoded address of a highest priority active request line among a plurality of request lines.

FIG. 1 shows a priority encoder 10 according to the prior art using purely combinatorial logic without feedback. Priority encoder 10 is described in U.S. Pat. No. 5,123,105, entitled "Priority Encoder for a Content Addressable Memory," the disclosure of which is hereby incorporated by reference into the present application. Priority encoder 10 uses purely combinatorial logic in that no delay elements are used. The priority encoder of FIG. 1 is without feedback in that the priority-encoded address bits A0, A1, and A2 are generated by circuits which operate independently of each other, and no feeding back of intermediate results from the computation of a first of these priority-encoded address bits is necessary in order to compute the value of a second of these priority-encoded address bits. For example, the logical value of lower order bit A0 does not depend on any results associated with the computation of higher order bits A1 or A2. Rather, lower order bit A0 is computed in parallel with higher order bits A1 and A2 as a direct boolean function of the input match lines or request lines D0–D7.

Priority encoder 10 priority-encodes eight input request lines D0–D7 into a 3-bit priority-encoded address having address bits A2, A1, and A0. To provide for expansion to a greater number of input request lines, three control signals are provided including an enable input signal EI, an enable output signal EO, and a group select signal GS. To expand the number of input lines, several of these priority encoders are daisy-chained using the EI, EO, and GS signals. For example, to accommodate 64 input lines D0–D63, eight priority encoders such as priority encoder 10 are used, a first priority encoder 10 receiving lines D0–D7, a second priority encoder 10 receiving lines D8–D15, a third priority encoder 10 receiving lines D16–D23, and so on, up to an eighth priority encoder 10 receiving lines D56–D63. In a serial fashion, the EO output of the first priority encoder 10 is connected to the EI input of the second priority encoder 10, the EO output from the second priority encoder 10 is connected to the EI input of the third priority encoder 10, and so on. The outputs A2, A1, and A0 of the eight respective priority encoders 10, which are designed to be in a high-impedance state unless enabled, are simply wired together to form an overall output A2, A1, and A0. Finally, the output GS of each of the eight priority encoders 10 is provided as a data line input into a ninth priority encoder 10, with the EO output of the eighth priority encoder 10 being connected to the EI input of the ninth priority encoder 10.

As described in U.S. Pat. No. 5,123,105, supra, the signals GS and EO are complementary. When coupled as described above, the first eight priority encoders 10 form a first portion for generating bits A2, A1, and A0 of a six-bit priority-encoded address, while the ninth priority encoder 10 forms a second portion for generating bits A5, A4, and A3 of the six-bit priority-encoded address.

The priority encoder 10, as well as the above-described daisy chaining scheme for expanding the number of request lines, has several disadvantages. First, the number of gates required is excessive, requiring large amounts of power and integrated circuit chip area. Second, as the number of input lines grows, the overall response time, i.e., the time from when the first EI signal is activated until the priority-encoded address can be read from the output lines, grows enormously because of the series propagation of enable signals through the daisy chain. For example, if the EI-to-EO propagation delay of the priority encoder 10 is a typical value of 6 ns, which corresponds to the propagation delay of two logic gates at 3 ns each, the overall response time would exceed 24 ns for a 64-line configuration, 48 ns for a 128-line configuration, and 96 ns for a 256-line configuration. However, if the number of request lines for each of the priority encoders 10 were increased to reduce this propagation delay, the overall number of gates would become extremely and unrealistically excessive.

FIG. 2 shows a priority encoder 100 according to the prior art designed to solve some of the above problems, the priority encoder 100 using delay lines and having feedback. Such a priority encoder is disclosed in U.S. Pat. No. 5,123,105, supra. The priority encoder 100 of FIG. 2 is a 16-line priority encoder having 16 input lines D0–D15, a node EN for receiving an enable signal, and four output lines A3–A0 for providing a priority-encoded output address.

Starting with the highest order priority-encoded address bit A3, the priority encoder 100 sequentially generates each priority-encoded address bit based on (a) the state of the input request lines D0–D15, and (b) results from previously generated output bits. When the signal EN is activated, the value of the most significant address bit A3 is computed by a first address bit generation circuit 150, and the remainder of the priority encoder circuit 100 remains disabled. Once A3 is determined, its value is provided at a node 242 for driving the gates of transistors 278–292. Intermediate signals at nodes 178–192 are thereby determined, these signals being provided to the remainder of the priority encoder 100. After a predetermined time, as dictated by the time constant of a delay element 300, a second address bit generation circuit 152 is activated for determining the value of the second-highest order bit A2. After a second predetermined time, as dictated by the time constant of a delay element 366, a third address bit generation circuit 154 is activated, and so on.

Unlike the priority encoder of FIG. 1, the priority encoder of FIG. 2 has feedback in that results from the determination of a higher order address bit is used in the determination of a lower order address bit. By using feedback, the priority encoder 100 of FIG. 2 is capable of generating a priority-encoded address using fewer elements and less integrated circuit chip area than the priority encoder of FIG. 1, especially as the number of address bits N and request lines $2^N$ grows large.

The priority encoder of FIG. 2, however, contains several disadvantages. One disadvantage is the large amount of capacitance at major switching nodes such as nodes 246, 248, 328, and 344. This causes excessive propagation delays between successive computations of the priority-encoded address bits A–A0. For example, if all inputs D0–D15 are low and then input D3 rises, it may take in excess of 20 ns for node A3 to go from low to high. For proper functioning, the delay time assigned to each of the delay elements, such as element 300, must be greater than the slowest rise time of its associated priority-encoded address bit, such as bit A3. Because each delay element must have an exemplary delay of, for example, 25 ns, the overall response time of the priority encoder 100 may exceed 100 ns.

A second disadvantage of the priority encoder 100 is that it uses delay elements, which is a generally undesirable practice in integrated circuit design. This problem may be avoided by synchronizing the successive activation of circuit portions 150–156 by using clock signals. However, the synchronization of the circuit 100 adds its own complexities, and does not reduce the capacitance, the required computation time, and the serial triggering requirements of circuit portions 150–156, and thus does not appreciably reduce the overall response time of the priority encoder 100.

For the priority encoder 100 of FIG. 2, the above capacitance and propagation delay problems worsen as the number of request lines increases. In particular, as the number of input lines is increased, the number of NMOS gates at nodes 268, 344, etc., must increase approximately linearly with the number of request lines. The capacitance and propagation delay at each stage of the priority encoder 100 grows accordingly. As a result, an exemplary priority encoder designed in accordance with FIG. 2 and having 128 lines may have an overall response time in excess of 500 ns. Such response times become even more intolerable for larger priority encoders. Additionally, the larger capacitances also necessitate larger driving currents and greater power consumption.

It is therefore desirable to provide a priority encoder for reliably generating priority-encoded addresses for large CAM arrays.

It is also desirable to provide a priority encoder which has faster response times in the generation of priority-encoded addresses even for large CAM arrays.

It is also desirable to provide a priority encoder which uses acceptable amounts of integrated circuit chip space and power.

It is also desirable to provide a priority encoder which is reliable and stable and does not necessitate the use of clocks or delay elements.

SUMMARY OF THE INVENTION

A priority encoder for generating a priority-encoded address which identifies a highest priority active request line is disclosed. The active request line having the lowest address has the highest priority. The priority encoder is capable of generating the priority-encoded address by determining information corresponding to the most significant bits of the priority-encoded address, and by feeding back this information for use in generating less significant bits of the priority-encoded address. The priority encoder is capable of so generating the priority-encoded address using purely combinatorial logic elements, including switch elements, without the need for clocks or delay elements. Accordingly, the priority encoder is capable of running in a completely asynchronous manner.

The priority encoder according to the preferred embodiment is organized by bus groups, each bus group having four members and representing two bits of the desired priority-encoded address. The bus groups range from a highest order bus group representing the two most significant bits of the priority-encoded address, to a lowest order bus group representing the two least significant bits of the priority-encoded address. For each bus group, the priority encoder includes a conversion circuit for mapping the logic states of the four members into two bits of the priority-encoded address.

For each bus group, the priority encoder comprises logic circuits for driving the bus group to the appropriate state. In particular, the priority encoder comprises a highest order logic circuit for driving the highest order bus group, a second highest order logic circuit for driving the second highest order bus group, and so on, through a lowest order logic circuit for driving the lowest order bus group. These logic circuits generally share many forward logic components. For example, the highest order logic circuit comprises many of the same logic components as the second highest order logic circuit, plus other logic components. These logic circuits are distinctive, however, in that each lower order logic circuit receives feedback signals from each higher order logic circuit for enabling appropriate portions of the lower order logic circuits.

When the priority encoder is presented with an array of request lines and enabled, the highest order bus group is driven to the appropriate state by the highest order logic circuit, the appropriate state being based on the address of the lowest-addressed active request line. Using combinatorial logic, and avoiding the use of delay elements, the highest order logic circuit provides feedback signals to the second highest order logic circuit. Based on the value of these feedback signals and based on the state of the request lines, the second highest order logic circuit drives the second highest bus group to the appropriate state. This process continues until the lowest bus group is driven to an appropriate state. As the bus groups are successively driven to their appropriate states, the conversion logic circuit associated with each bus group drives its two respective priority-encoded output bits to their correct values.

The request lines of the priority encoder are organized into four unique, sequential quadrants of request lines. Each member of the highest order bus group corresponds to a one of the four quadrants of request lines and is set to an active state when that quadrant contains the lowest-address active request line. The highest order logic circuit comprises combinatorial logic for producing the boolean OR of all request lines for producing a request detect signal. The highest order logic circuit further comprises combinatorial logic for producing the boolean OR of each of the four quadrants of request lines, for producing four quadrant detect signals. Using the four quadrant detect signals, the highest order logic circuit activates the appropriate member of the highest order bus group.

The highest order logic circuit further comprises circuitry for providing four feedback signals to the second highest order logic circuit, one feedback signal for each quadrant of request lines. Three of the feedback signals are set to an inactive state, while one of the feedback signals is set to an active state. The active feedback signal corresponds to that quadrant of request lines having the lowest-addressed active request line.

The second highest order logic circuit comprises four substantially identical quadrant circuits, each quadrant circuit corresponding to a one of the four members of the highest order bus group and therefore to one quadrant of request lines. Each quadrant of request lines in turn comprises four unique, sequential subquadrants of request lines for a total of sixteen subquadrants of request lines. Each quadrant circuit is associated with four sequential subquadrants of request lines. Each quadrant circuit receives the feedback signal associated with its respective quadrant from the highest order logic circuit.

Each quadrant circuit comprises combinatorial logic for providing a logical OR of each of its subquadrants of request lines for providing four subquadrant detect signals. Each quadrant circuit is capable of driving the second highest order bus group responsive to its four subquadrant detect signals. However, only one of the four quadrant circuits is enabled to drive the second highest order bus group, in particular the quadrant circuit receiving the active feedback signal from the highest order logic circuit. In this manner, the quadrant circuit corresponding to the quadrant containing the lowest active address line determines the values of the next most significant two bits of the priority-encoded address, as desired.

Each quadrant circuit is capable of providing four feedback signals to a third-highest order logic circuit, activating only a feedback signal corresponding to the subquadrant containing the lowest-address active request line in its quadrant. The priority encoder comprises circuitry which repeats the above process until the lowest order bus group is driven to the appropriate state, for determining the lowest order bits of the priority-encoded address. Thus, if necessary, the third-highest order logic circuit comprises sixteen subquadrant circuits, each subquadrant circuit corresponding to a one of the sixteen subquadrants of request lines. Each subquadrant circuit receives the feedback signal associated with its respective quadrant from the highest order logic circuit, as well as the feedback signal associated with its respective subquadrant from the second-highest order logic circuit, for appropriately driving the third-highest order bus group.

The priority encoder of the preferred embodiment is capable of having a large number of input request lines while keeping down the propagation delays and the number of circuit elements used. Because only discrete numbers of combinatorial logic elements are coupled together at a given stage, circuit capacitances are kept low. Even further, because no delay elements are needed, no associated delay margin needs to be designed in to each stage of the circuit. This results in faster and more reliable circuit operation.

BRIEF DESCRIPTION OF THE DRAWINGS

The above mentioned objects and other objects, features, and advantages of the preferred embodiment may be better understood by referring to the following detailed description, which should be read in conjunction with the accompanying drawings in which:

FIGS. 8A–8F show a subquadrant circuit of the priority encoder of FIG. 6A;

DETAILED DESCRIPTION OF THE INVENTION

Figure 3:
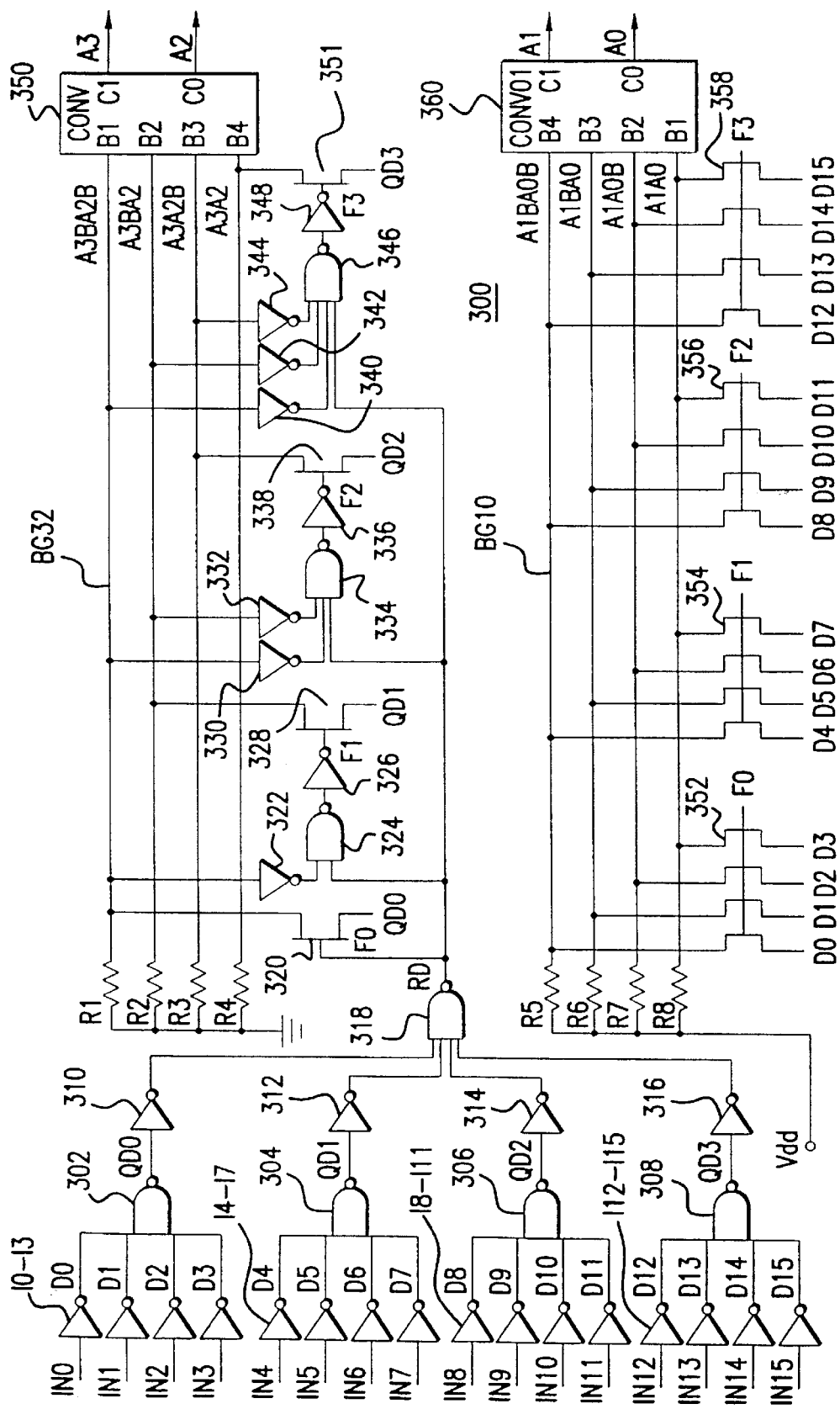
FIG. 3 show a priority encoder according to a preferred embodiment.

FIG. 3 illustrates a priority encoder 300 in accordance with a preferred embodiment. Priority encoder 300 is a 16 request line priority encoder for providing a 4-bit priority-encoded address. The active request line having the lowest address has the highest priority.

Priority encoder 300 comprises 16 active high input lines IN0–IN15 for coupling to request lines which may be, for example, the match lines of a CAM. Priority encoder 300 further comprises four output lines A3–A0 for providing the 4-bit priority-encoded address. The active high input lines IN0–IN15 are active high in that they are normally at a low logic level, and are driven high for indicating an active request. As shown in FIG. 3, active high input lines IN0–IN15 are coupled respectively through inverters I0–I15 to active low input lines D0–D15. It is to be understood that a priority encoder according to the preferred embodiment may have input lines which are either active high or active low. For active low request line applications, active low input lines D0–D15 are coupled directly to the request lines, and inverters I0–I15 are not used. For simplicity and clarity of disclosure, the active low input lines D0–D15 will simply be referred to as input lines D0–D15.

As shown in FIG. 3, input lines D0–D15 are grouped into sequential quadrants, a first quadrant comprising input lines D0–D3, a second quadrant comprising input lines D4–D7, and so forth. Priority encoder 300 comprises a NAND gate 302 for receiving input lines D0–D3, a NAND gate 304 for receiving input lines D4–D7, a NAND gate 306 for receiving input lines D8–D11, and a NAND gate 308 for receiving input lines D12–D15. Each of the NAND gates 302, 304, 306, and 308 provides the logical NAND of its respective inputs to nodes QD0, QD1, QD2, and QD3. Because input lines D0–D15 are active low, each of the nodes QD0–QD3 will be driven high if at least one of the input lines in its associated quadrant is active, and remains low otherwise. Therefore, the signal at each of nodes QD0–QD3 serves as a quadrant detect signal.

Priority encoder 300 further comprises inverters 310, 312, 314, and 316 having inputs coupled to nodes QD0–QD3, respectively, and having outputs coupled to the input of a NAND gate 318. The output of NAND gate 318 is coupled to a node RD. The node RD is driven high when there is an active request associated with any of the input lines D0–D15 of the priority encoder 300. Therefore, the signal at node RD serves as a request detect signal.

Priority encoder 300 further comprises a bus group BG32 which corresponds to the highest priority bits A3 and A2 of the priority-encoded output address. Bus group BG32 comprises four members, each member corresponding to one of the four possible states of bits A3 and A2. In particular, bus group BG32 comprises a member A3BA2B corresponding to the state A3=0 and A2=0, a member A3BA2 corresponding to the state A3=0 and A2=1, a member A3A2B corresponding to the state A3=1 and A2=0, and a member A3A2 corresponding to the state A3=1 and A2=1. Thus, the bus group BG32 has the characteristic that each of its members corresponds to a unique quadrant of input lines D0–D15: member A3BA2B corresponds to input lines D0–D3, each address of D0–D3 having A3=0 and A2=0; member A3BA2 corresponds to input lines D4–D7, each address of D4–D7 having A3=0 and A2=1; member A3A2B corresponds to input lines D8–D11, each address of D8–D11 having A3=1 and A2=0; and member A3A2 corresponds to input lines D12–D15, each address of D12–D15 having A3=1 and A2=1. The members of bus group BG32 are active high and are grounded through resistors R1–R4, respectively, when they are not being driven.

Priority encoder 300 drives bus group BG32 responsive to the values of the request detect signal at node RD and the quadrant detect signals at nodes QD0–QD3. Priority encoder 300 comprises a switch transistor 320 coupled between node QD0 and member A3BA2B, switch transistor 320 having a gate at a node F0 coupled to node RD. In operation, when node F0 is high, indicating that at least one of the input lines D0–D15 is active, switch transistor 320 passes the value of the quadrant detect signal at node QD0 to member A3BA2B of bus group BG32. Therefore, if one of the input lines D0–D3 is active, member A3BA2B will be driven high, and will remain low otherwise.

Figure 4:
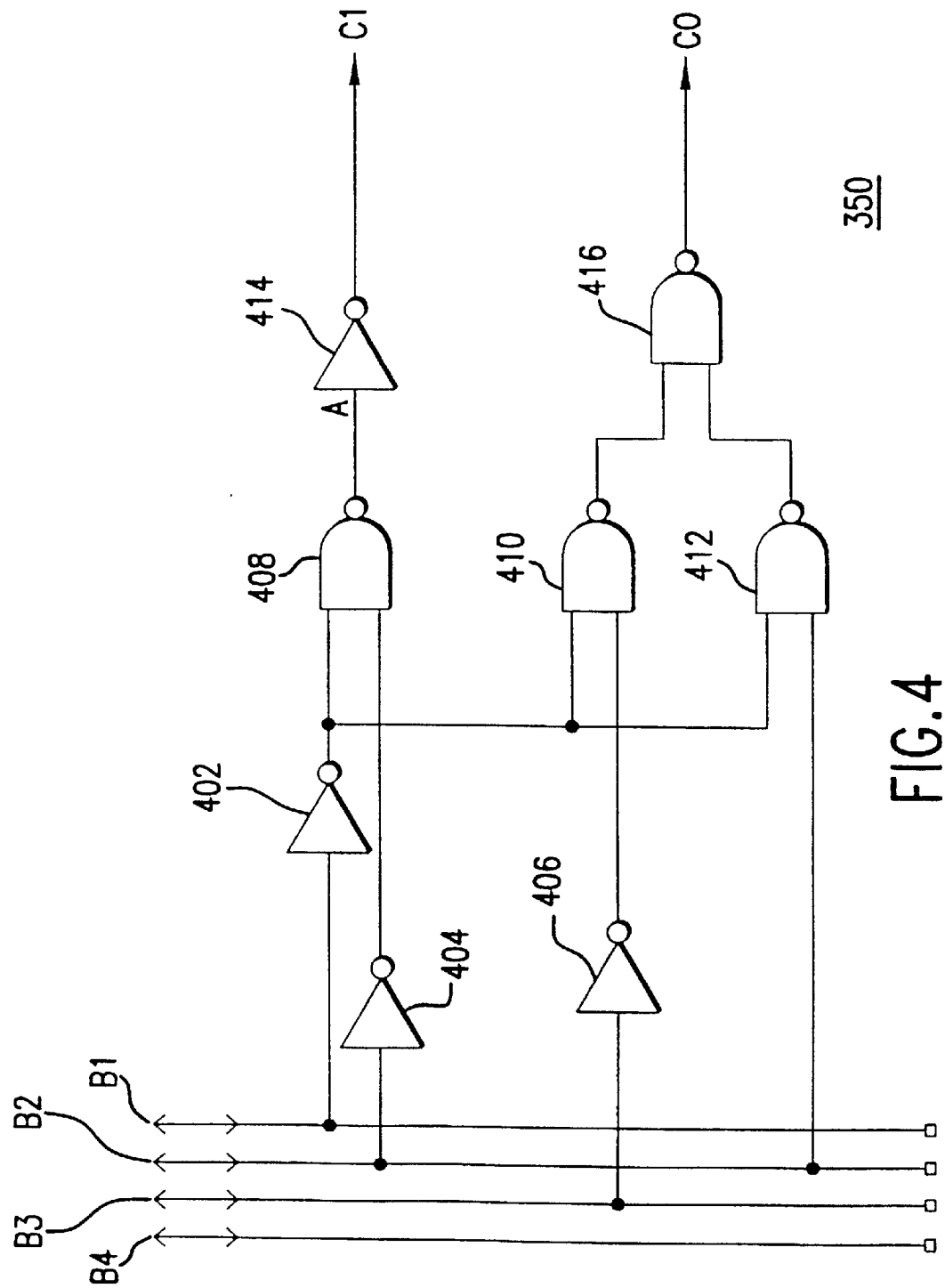
FIG. 4 shows an active high bus group conversion circuit of the priority encoder of FIG. 3.

Priority encoder 300 further comprises a conversion circuit 350 for receiving the members of the bus group BG32 and for providing the highest order priority-encoded address bits A3 and A2 responsive thereto. Conversion circuit 350 comprises an input B1 for coupling to member A3BA2B, an input B2 for coupling to member A3BA2, an input B3 for coupling to member A3A2B, an input B4 for coupling to member A3A2, and outputs C1 and C0 for coupling to output lines A3 and A2, respectively. FIG. 4 shows the conversion circuit 350 in detail. Conversion circuit 350 comprises four inverters 402, 404, 406, and 414 and four NAND gates 408, 410, 412, and 416 coupled as shown in FIG. 4. The following truth table shows the operation of conversion circuit 350:

TABLE 1

Truth Table for Conversion Circuit 350

| B1 | B2 | B3 | B4 | C1 | C0 |
|----|----|----|----|----|----|
| 1  | X  | X  | X  | 0  | 0  |
| 0  | 1  | X  | X  | 0  | 1  |
| 0  | 0  | 1  | X  | 1  | 0  |
| 0  | 0  | 0  | 1  | 1  | 1  |
| 0  | 0  | 0  | 0  | 1  | 1  |

(X = don't care)

As described previously, A3BA2B will be high whenever at least one of the input lines D0–D3 is active. Because lower-addressed input lines have higher priority according to the priority scheme of the present embodiment, it is desired to drive the output lines to A3=0 and A2=0 whenever at least one of the input lines D0–D3 is active. As shown by the above truth table, the address bits A3, A2 are indeed driven to A3=0 and A2=0 by conversion circuit 350 whenever member A3BA2B is high, i.e. when at least one of input lines D0–D3 is active.

It is to be noted that the last row in Table 1 corresponds to a circumstance in which the request detect signal at node RD is zero, reflecting that no input line is active. In this circumstance, the priority encoder 300 is not enabled, and all outputs A3–A0 are simply to be driven to a precharged-high state. This precharged high-state of A3–A0 incidentally reflects the same output as if an active request has occurred on the highest-address input line D15. In an embodiment in which the priority encoder 300 is used in a CAM, other CAM circuitry ensures that this data is not used. In particular, the CAM uses a match flag which driven high when at least one of the inputs D0–D15 is active and low otherwise. In another embodiment, the request detect signal at node RD is coupled directly to the match flag for driving the value of the match flag.

Priority encoder 300 further comprises a switch transistor 328 coupled between node QD1 and member A3BA2 and having a gate. An inverter 322 is coupled between member A3BA2B and a first input of a NAND gate 324, the RD node is coupled to a second input of the NAND gate 324, and the output of NAND gate 324 is coupled to an inverter 326. The output of inverter 326 is coupled to the gate of switch transistor 328 at a node F1. Letting A3BA2B represent the signal present at member A3BA2B, and letting RD represent the request detect signal at node RD, the boolean function (RD ●A3BA2B) is presented at node F1. Accordingly, the quadrant detect signal at node QD1 is passed to member A3BA2 only when RD is high and A3BA2B is low. As a result, member A3BA2 is driven high when (1) at least one of the input lines D0–D15 is active, (2) when none of the input lines D0–D3 is active, and (3) when one of the input lines in the D4–D7 quadrant is active. In such a case, as shown by the above truth table, the outputs A3 and A2 are driven to A3=0 and A2=1, as desired.

Member A3BA2 is driven low when (1) at least one of the input lines D0–D15 is active, (2) when none of the input lines D0–D3 is active, and (3) when none of the input lines in the D4–D7 quadrant is active. In such a case, as shown in Table 1, the outputs at A3 and A2 will be equal to one of the lower three entries of Table 1, as desired.

It is to be appreciated that node F1 will remain low when the signal at member A3BA2B is high. In this case, member A3BA2 remains isolated from node QD1. However, as shown in Table 1, when the signal B1 corresponding to member A3BA2B is high, the signals at B2, B3, and B4 are all don't cares. Thus, even if member A3BA2 would float to an indeterminate state, the value of the output at A3 and A2 will not be affected, as desired.

Priority encoder 300 further comprises a switch transistor 338 coupled between node QD2 and member A3A2B and having a gate coupled to a node F2. An inverter 332 is coupled between member A3BA2 and a first input of a NAND gate 334, an inverter 330 is coupled between member A3BA2B and a second input of NAND gate 334, the RD node is coupled to a third input of the NAND gate 334, and the output of NAND gate 334 is coupled to an inverter 336. The output of inverter 336 is coupled to the gate of switch transistor 338 at a node F2. Letting A3A2B represent the signal present at member A3A2B, the boolean function (RD ●A3BA2B●A3BA2) is presented at node F2. Accordingly, the quadrant detect signal at node QD2 is passed to member A3A2B only when RD is high, A3BA2B is low, and A3BA2 is low. As a result, member A3A2B is driven high when (1) at least one of the input lines D0–D15 is active, (2) when none of the input lines D0–D3 is active, (3) when none of the input lines D4–D7 is active, and (4) when one of the input lines in the D8–D11 quadrant is active. In such a case, as shown by Table 1, the outputs A3 and A2 are driven to A3=1 and A2=0, as desired. It is to be noted that member A3A2B is driven low when (1) at least one of the input lines D0–D15 is active, and (2) when none of the input lines D0–D11 is active. Finally, if one of the input lines D0–D7 is active, node F2 is driven low and member A3A2B remains isolated from the quadrant detect signal at node QD2. This does not adversely affect the state of output lines A3 and A2 because entry B3 in Table 1 is a don't care is this case.

Priority encoder 300 further comprises a switch transistor 351 coupled between node QD3 and member A3A2 and having a gate at a node F3. Inverters 340, 342, and 344, are coupled respectively between members A3BA2B, A3BA2, and A3A2B and three inputs of a NAND gate 346. The node RD is coupled to a fourth input of the NAND gate 346, and the output of NAND gate 346 is coupled to the input of an inverter 348. The output of inverter of 348 is coupled to node F3 such that the signal present at node F3 is equal to the boolean function (RD ●A3BA2B●A3BA2●A3A2B). Accordingly, the quadrant detect signal at node QD3 is passed to member A3BA2 when RD is high and none of the input lines D0–D11 is active. In such a case, a high signal will be passed to member A3A2 and output lines A3 and A2 will be A3=1 and A2=1.

The bus BG32 constitutes a highest order bus group for the priority encoder 300, the bus group BG32 driving the two highest order bits of the output address A3–A0. The logic circuitry for driving bus group BG32 constitutes a highest order logic circuit.

Priority encoder 300 further comprises a lower order bus group BG10 associated with two lowest order output bits A1 and A0. Priority encoder 300 further comprises a lowest order logic circuit for appropriately driving bus group BG10. Advantageously, the highest order logic circuit provides to the lowest order logic circuit a set of combinatorially produced feedback signals for enabling appropriate portions of the lowest order logic circuit. In the priority encoder 300 of FIG. 3, these feedback signals are provided at nodes F0–F3.

Figure 5:
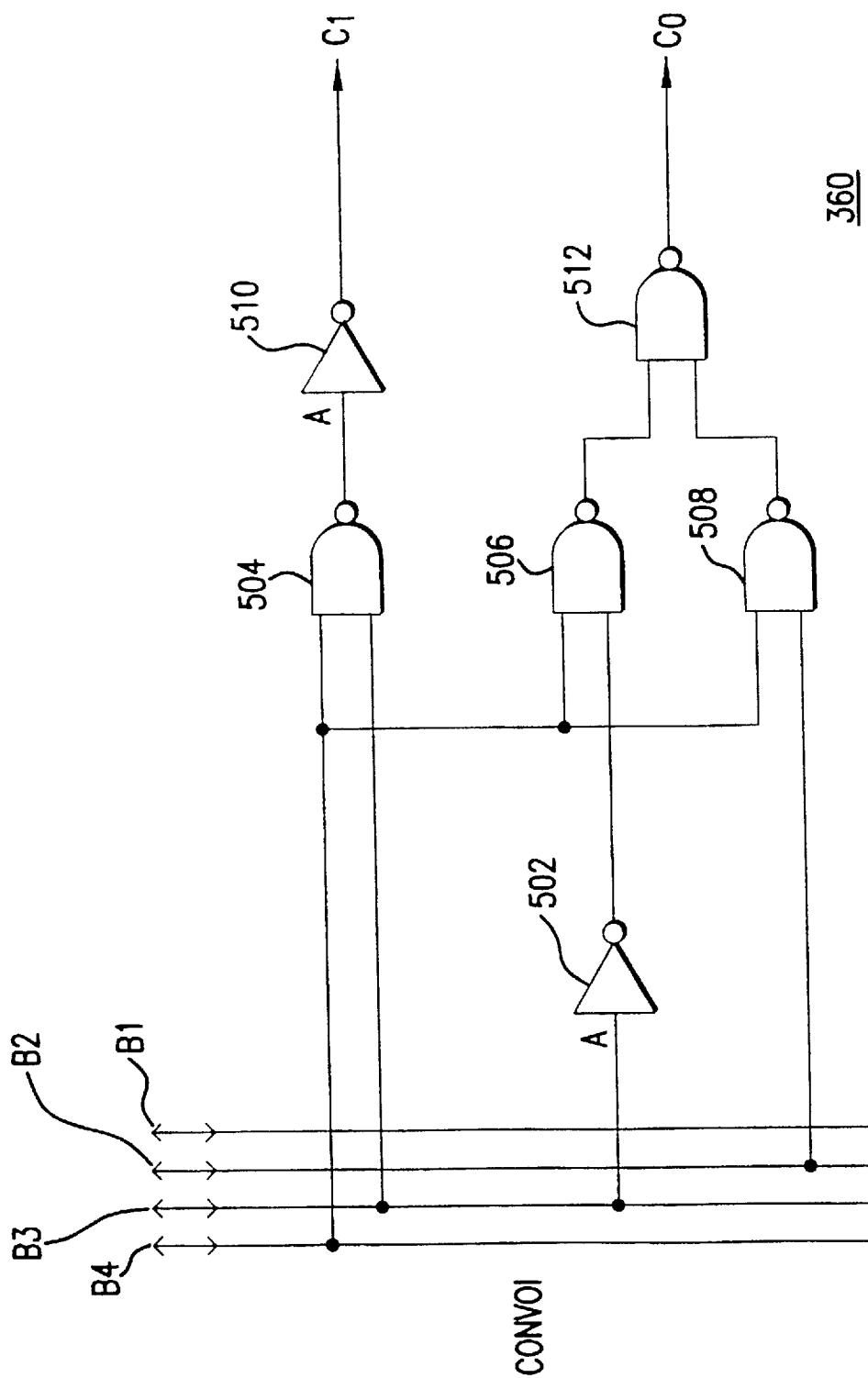
FIG. 5 shows an active low bus group conversion circuit of the priority encoder of FIG. 3.

Bus group BG10 is an active low bus group comprising members A1BA0B, A1BA0, A1A0B, and A1A0. Each of the members is coupled to Vdd through resistors R5–R8, respectively, for ensuring a high logic state when the member is not being driven. Priority encoder 300 comprises a conversion circuit 360 for receiving the members of the bus group BG10 and for providing the lowest order priority-encoded address bits A1 and A0 responsive thereto. Conversion circuit 360 comprises an input B4 for coupling to member A1BA0B, an input B3 for coupling to member A1BA0, an input B2 for coupling to member A1A0B, an input B1 for coupling to member A1A0, and outputs C1 and C0 for coupling to output lines A1 and A0, respectively. FIG. 5 shows the conversion circuit 360 in detail. Conversion circuit 360 comprises two inverters 502 and 510, and four NAND gates 504, 506, 508, and 512 coupled as shown in FIG. 5. Conversion circuit 360 produces the following truth table:

TABLE 2

Truth Table for Conversion Circuit 360

| B1 | B2 | B3 | B4 | C1 | C0 |
|----|----|----|----|----|----|
| X  | X  | X  | 0  | 0  | 0  |
| X  | X  | 0  | 1  | 0  | 1  |
| X  | 0  | 1  | 1  | 1  | 0  |
| 0  | 1  | 1  | 1  | 1  | 1  |
| 1  | 1  | 1  | 1  | 1  | 1  |

(X = don't care)

Priority encoder 300 comprises quadrant circuits 352, 354, 356, and 358 coupled between inputs D0–D15 and bus group BG10 as shown in FIG. 3. In particular, quadrant circuit 352 is associated with the D0–D3 quadrant, quadrant circuit 354 is associated the D4–D7 quadrant, quadrant circuit 356 is associated the D8–D11 quadrant, and quadrant circuit 358 is associated the D12–D15 quadrant. Quadrant circuit 352 comprises four switch transistors, each transistor having its gate coupled to node F0, each transistor being coupled between a one of input lines D0–D3 and one member of bus group BG10 as shown in FIG. 3. When node F0 is driven high, input lines D0–D3 will be coupled to member A1BA0B, member A1BA0, member A1A0B, and member A1A0, respectively. Quadrant circuits 354, 356, and 358 are configured similarly to quadrant circuit 352 with respect to their respective quadrants of input lines.

When at least one of the input lines in the D0–D3 quadrant is active, the highest order logic circuit driving bus group BG32 will provide that the feedback signal at node F0 will be high and the feedback signals at nodes F1–F3 will be low, as described previously. Accordingly, the quadrant circuit 352 will drive the bus group BG10 to the appropriate state responsive to the state of the input lines D0–D3. Recalling that input lines D0–D3 are active low, the appropriate members of bus group BG10 will be driven to a low state and will be provided to conversion circuit 360 for providing the appropriate values of output lines A1 and A0. For example, if line D1 is active, bus group BG10 member A1BA0 will be low and other members of bus group BG10 will be high. Referring to Table 2, the addresses A1 and A0 will be equal to A1=0 and A0=1, as desired.

It is to be appreciated that, as dictated by Table 2, the appropriate intra-quadrant priority is assigned by the conversion circuit 360 when two or more members of the quadrant D0–D3 are active. For example, if both lines D2 and D3 are active, then bus lines A1A0B and A1A0 are driven low while members A1BA0B and A1BA0 and driven high. Referring to Table 2, the output lines A1, A0 will be equal to A1=1 and A0=0, as desired.

In the priority encoder 300 of FIG. 3, the feedback signals at nodes F0–F3 constitute enable signals passed from the highest order logic circuit to the lowest order logic circuit for enabling the appropriate quadrant circuit in the lowest order logic circuit. Only one of the feedback signals at the nodes F0–F3 will be active during any priority encoding cycle, and therefore only one of the quadrant circuits 352, 354, 356, or 358 will be active. This is desired because only one address can be driven to the outputs A1, A0, and this address must correspond to the lowest active request line within the lowest active quadrant of request lines. As an example of the operation of priority encoder 300, if input lines D9 and D14 are active whereas all other input lines are inactive, the highest order logic circuit will drive A3 to 1 and A2 to 0, and will drive node F2 high to enable quadrant circuit 356. Nodes F0, F1, and F3 will be driven low so that quadrant circuits 352, 354, and 358 remain disabled. This is the desired result because the quadrant circuit associated with input line D9 should drive the output lines A1 and A0, and not the quadrant containing the lower priority input line D14.

Among the advantages of the preferred embodiment is the ability to design a priority encoder having a large number of inputs using similar design principles as used in the circuit of FIG. 3. In particular, where there are $2^N$ request signals from $2^N$ request lines, the circuit is to be designed with N/2 bus groups, each bus group comprising four members and driving two adjacent output address bits. The N/2 bus groups are arranged from a highest order bus group for driving the highest two bits of the N-bit priority-encoded address, to a lowest order bus group for driving the lowest two bits of the priority-encoded address. Each bus group will be associated with a unique conversion circuit for driving two adjacent output bits responsive to the state of the members of the bus group. Each bus group will be associated with a logic circuit for appropriately driving the members of the bus group. Generally speaking, there will be shared elements of the logic circuits driving the individual bus groups, in particular a cascaded series of NAND gates and inverters analogous to the elements 302–318 of FIG. 3 for providing an overall request detect, quadrant detect signals, subquadrant detect signals, and so forth as necessary for indicating active input lines within appropriate intervals of input lines. The circuit for coupling to $2^N$ request lines will include means for combinatorially providing feedback signals from each higher order logic circuit to each lower order logic circuit such that the priority encoder is capable of sequentially producing the highest order address bits, followed by the second highest order address bits, followed by the third highest address bits, and so on down to the lowest order address bits. Each lower order logic circuit will comprise four subcircuits with respect to its next highest order logic circuit. Feedback signals provided by the next highest order logic circuit together with all higher order logic circuits will enable the appropriate subcircuits for driving that bus group. Generally speaking, at the lowest order logic circuit the input lines themselves will be used to drive the lowest order bus group, as enabled by feedback signals provided by every higher order bus group, whereas at higher order logic circuits ORed combinations of input lines will be used to drive the higher order bus groups, as enabled by feedback signals from even higher order logic circuits.

By way of non-limiting example, a 256 input priority encoder would comprise four bus groups, each bus group having four members. These bus groups would comprise bus group BG76 for driving address lines A7 and A6, a bus group BG54 for driving address bits A5 and A4, a bus group BG32 for driving address bits A3 and A2, and a bus group BG10 for driving bus group 10. An overall request detect signal will be generated which is the logical OR of all 256 inputs. Bus group BG76 will be driven by a highest order logic circuit which generates four quadrant detect signals associated with the quadrants D0–D63, D64–D127, D128–D191, and D192–D255 and drives bus group BG76 in a manner analogous to that shown for the highest order bus group in FIG. 3. Bus group BG54 will be driven by a second highest order logic having four quadrant circuits, only one of the four quadrant circuits being enabled by feedback signals provided by the highest order logic circuit. The enabled quadrant circuit will drive bus group BG54 responsive to four subquadrant detect signals generated from the logical ORs of input lines contained within subquadrants of its respective quadrant. This process will continue down to bus group BG10, wherein a lowest order logic circuit will comprise 64 "sub-subquadrant" circuits, each resembling quadrant circuit 352 of FIG. 3. Each sub-subquadrant circuit will be enabled by an enable signal which is a combinatorial result of feedback signals provided by each upper level logic circuit.

FIGS. 6A–6E illustrate a priority encoder 600 in accordance with another preferred embodiment. Priority encoder 600 is a 1024-line priority encoder for priority encoding 1024 input lines IN0–IN1023 and for providing a 10-bit output address onto 10 output lines A9–A0.

Figure 6A:
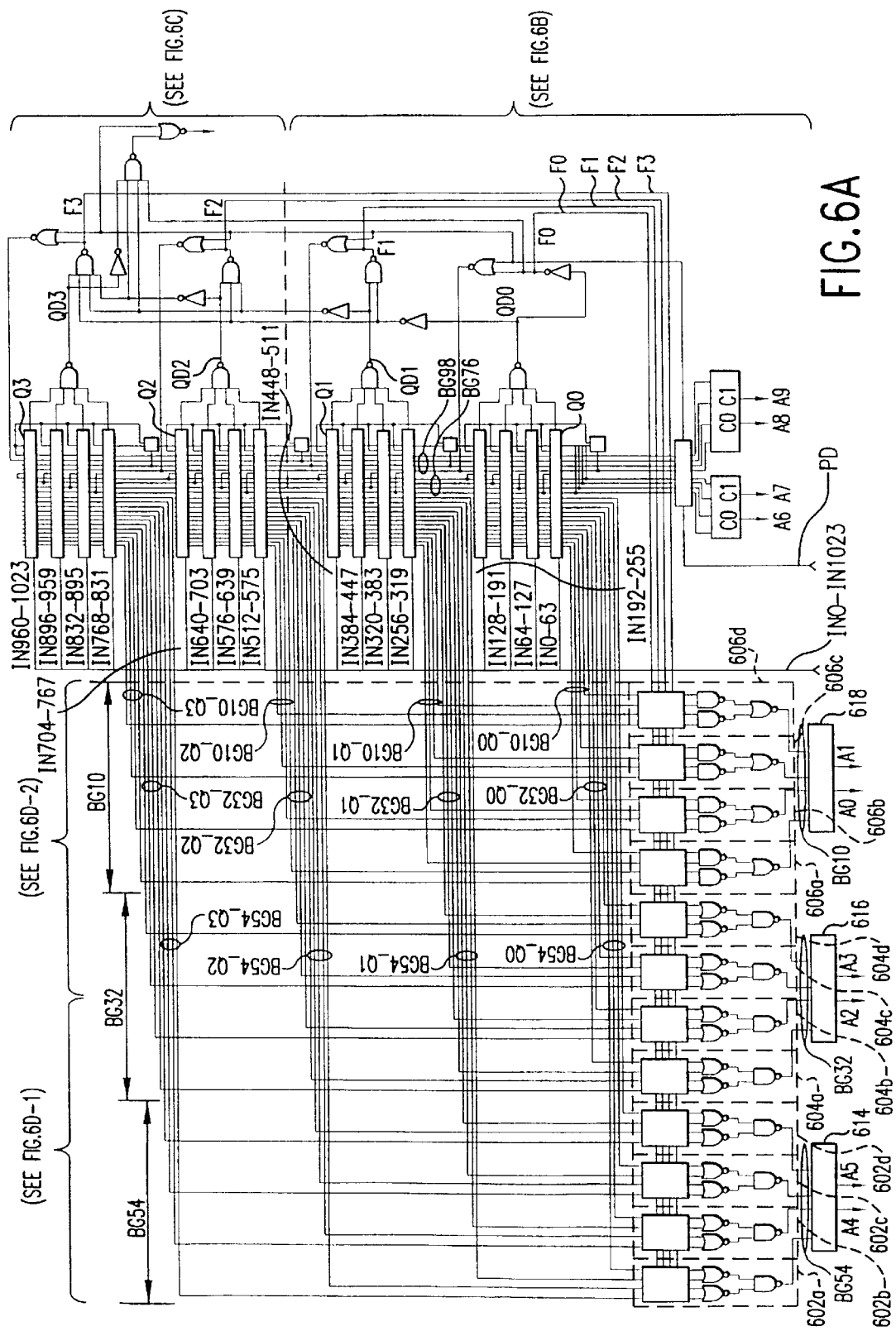
FIGS. 6A–6E show a priority encoder according to another referred embodiment.

As shown in FIG. 6A, the priority encoder 600 comprises four quadrant circuits Q0, Q1, Q2, and Q3, input lines IN0–IN1023 and output lines A9–A0. Each quadrant circuit Q0–Q3 comprises four individual subquadrant circuits which are described more fully infra. Priority encoder 600 further comprises a highest order bus group BG98 and a second highest order bus group BG76, represented in FIG. 6A and running through all of quadrant circuits Q0–Q3.

Figure 6B:
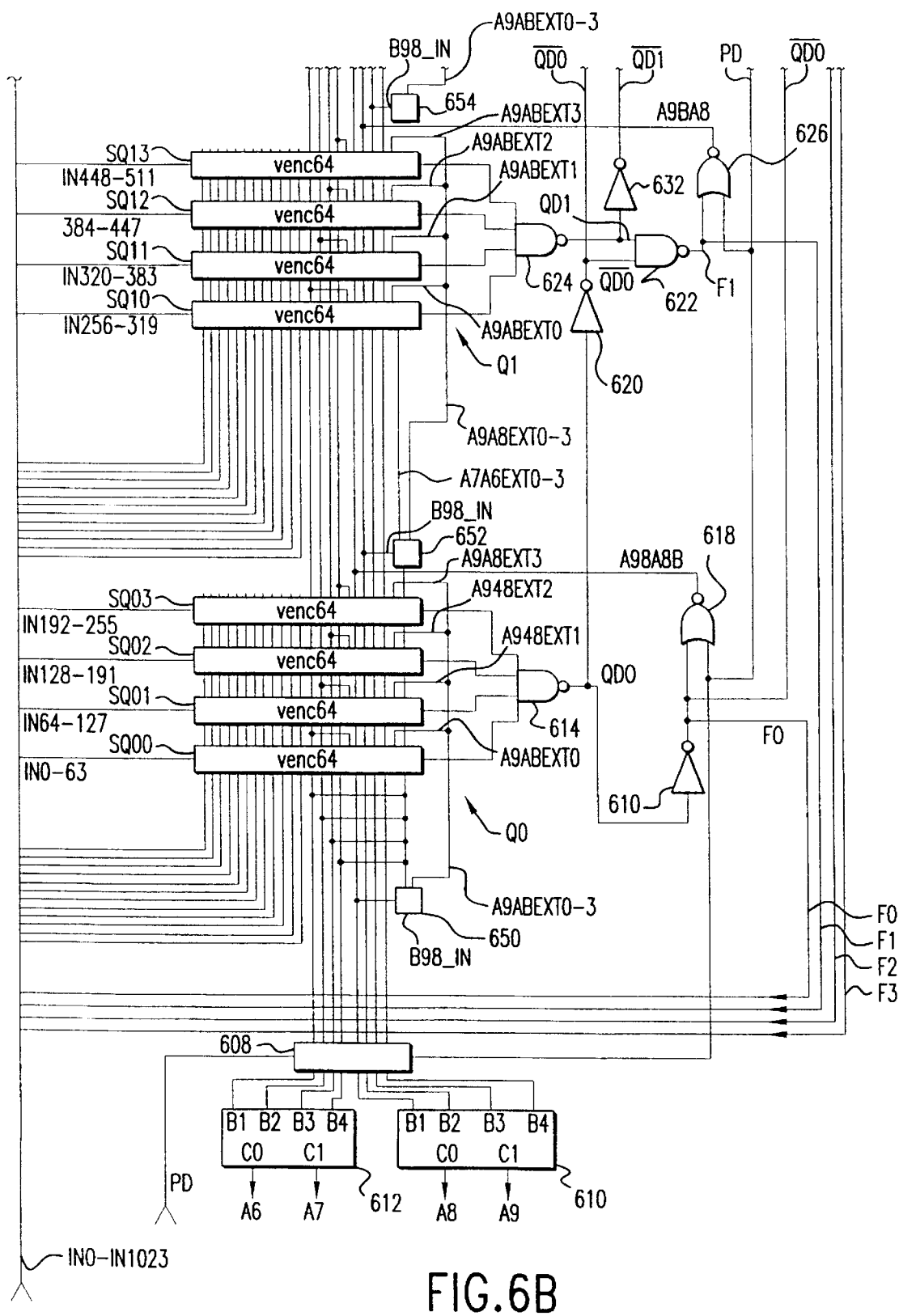
Figure 6C:
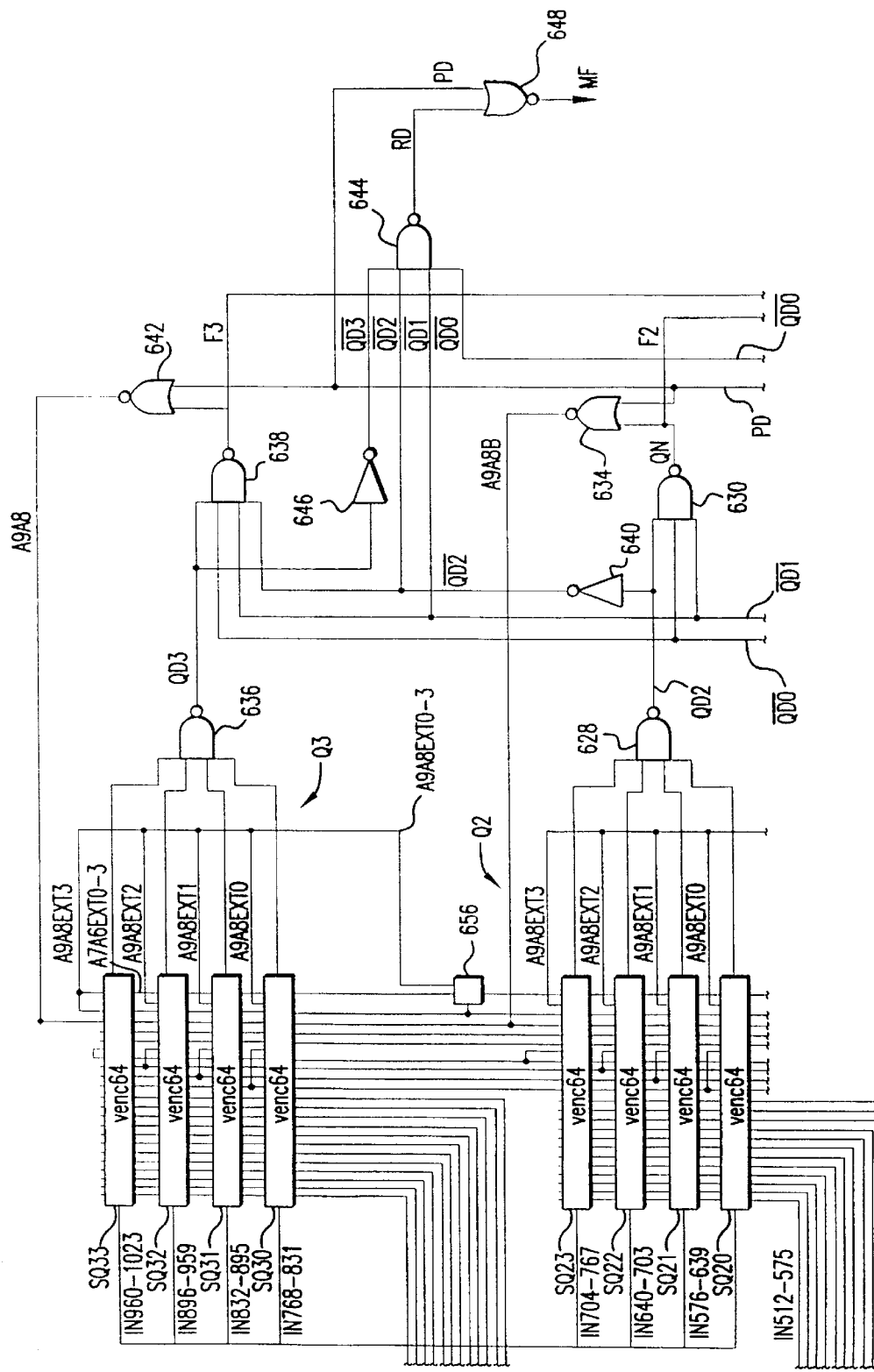

Priority encoder 600 further comprises, for each of the quadrants Q0–Q3, lower order bus groups corresponding to successive pairs of lower order bits. For example, quadrant Q0 comprises bus group BG54_Q0, BG32_Q0, and bus group BG10_Q0. Quadrants Q1, Q2, and Q3 comprise bus groups similarly designated, as shown in FIGS. 6A, 6B, and 6C. It is to be noted that a priority encoder in accordance with the present invention is not required to comprise individual bus groups segregated by quadrant as with priority encoder 600. Rather, in an alternative preferred embodiment not shown, there may be bus groups BG54, BG32, and BG10 running through all quadrants in a manner similar to bus groups BG98 and BG76. However, for practical considerations, it is desirable to segregate these bus groups into smaller quadrants and feed them into passgate/OR circuits 602a–d and 604a–d, and passgate/AND circuits 606a–d.

Noting that the individual members of bus group BG54 are active high, the purpose of the passgate/OR circuit 602a–d is to drive the overall bus group BG54 with the appropriate one of the quadrant bus groups BGS4_Q0, BG54_Q1, BG54_Q2, and BGS4_Q3 corresponding to the lowest active quadrant. As will be described infra, this is performed responsive to gating or feedback signals from the quadrants Q0–Q3. Thus, for example, if quadrant Q2 contains the lowest-addressed active request line, passgate/OR circuits 602a–d will ensure that the members A5BA4B, A5BA4, A5A4B, and A5A4 of bus group BG54 will be driven by the values of members A5BA4B_Q2, A5BA4_Q2, A5A4B_Q2, and A5A4_Q2 of bus group BG54_Q2. Similarly, the purpose of the passgate/OR circuit 604a–d is to pass the values of the members of the corresponding bus group from the lowest active quadrant onto the overall bus group BG32.

Noting that the individual members of bus group BG10 are active low, the purpose of the passgate/AND circuits 606a–d is to drive the overall bus group BG10 with the appropriate one of the quadrant bus groups BG10_Q0, BG10_Q1, BG10_Q2, and BG10_Q3 corresponding to the lowest active quadrant. Thus, for example, if quadrant Q2 contains the lowest-addressed active request line, passgate/AND circuits 606a–d will ensure that the members A1BA0B, A1BA0, A1A0B, and A1A0 of bus group BG10 will be driven by the values of members A1BA0B_Q2, A1BA0_Q2, A1A0B_Q2, and A1A0_Q2 of bus group BG10_Q2.

Figures 1, 6D:
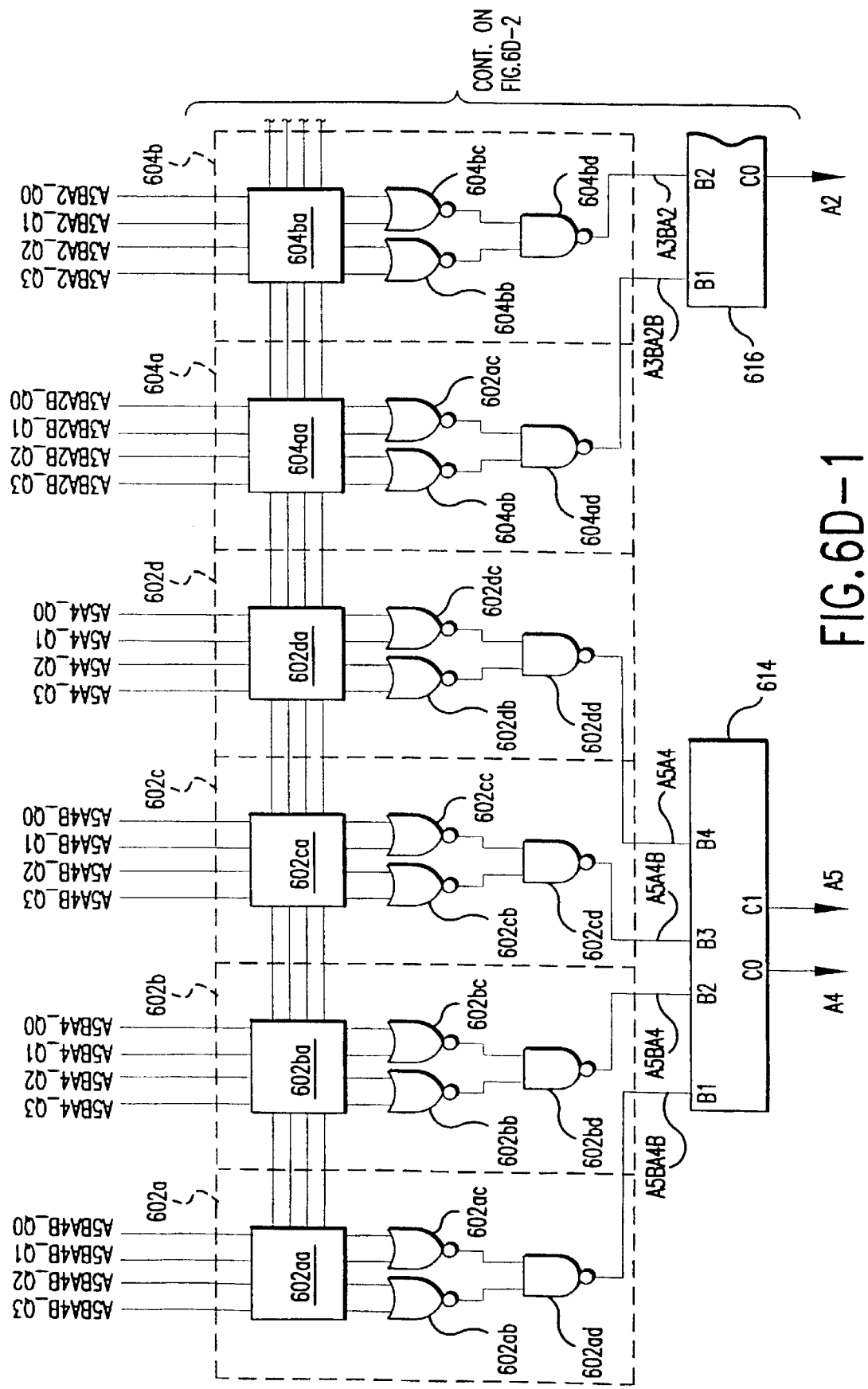
Figures 2, 6D:
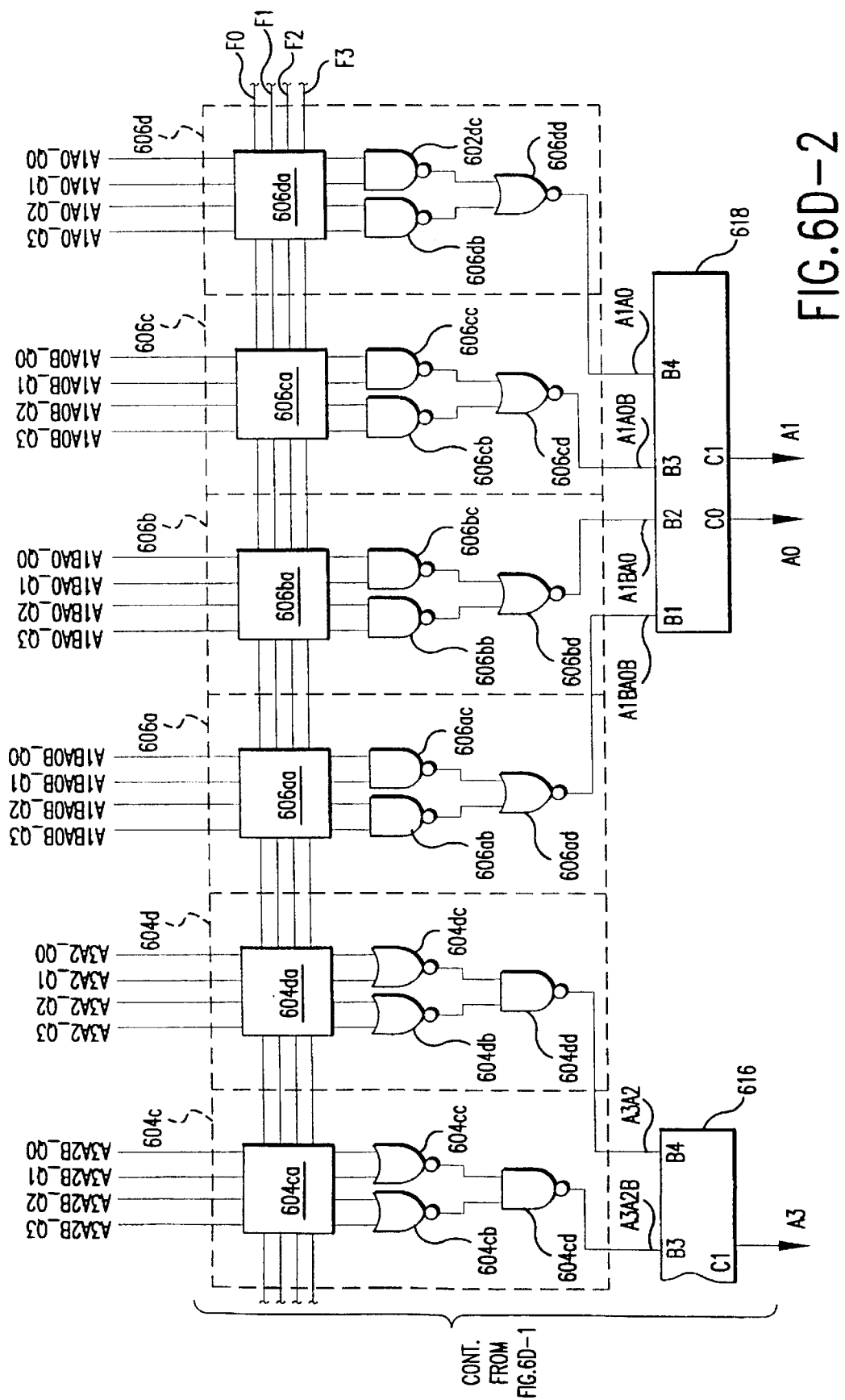

An exemplary passgate/OR circuit 602a is now described. As shown in FIG. 6D, passgate/OR circuit 602a comprises a passgate circuit 602aa having four input/output nodes H3, H2, H1, and H0. Passgate circuit 602aa further comprises feedback inputs BLK0, BLK1, BLK2, and BLK3. As shown in FIG. 6D, input/output nodes H3, H2, H1, and H0 of passgate 602aa are coupled respectively to quadrant bus group members A5BA4B_Q3, A5BA4B_Q2, A5BA4B_Q1, and A5BA4B_Q0. Also as shown in FIG. 6D, feedback inputs BLK0, BLK1, BLK2, and BLK3 are coupled to signals F0, F1, F2, and F3, respectively, which are provided by the quadrant circuits Q0, Q1, Q2, and Q3 in a manner to be described infra. As will be described infra, the quadrant circuits Q0–Q3 will ensure that all but one of the signals F0–F3 will to be driven high, and thus single active one of the signals F0–F3 will represent that quadrant having the lowest-addressed active request line. Thus, for example, if the lowest-addressed active request line is located in quadrant Q3, the signals F0, F1, and F2 will be high, while signal F3 will be low.

Figure 11A:
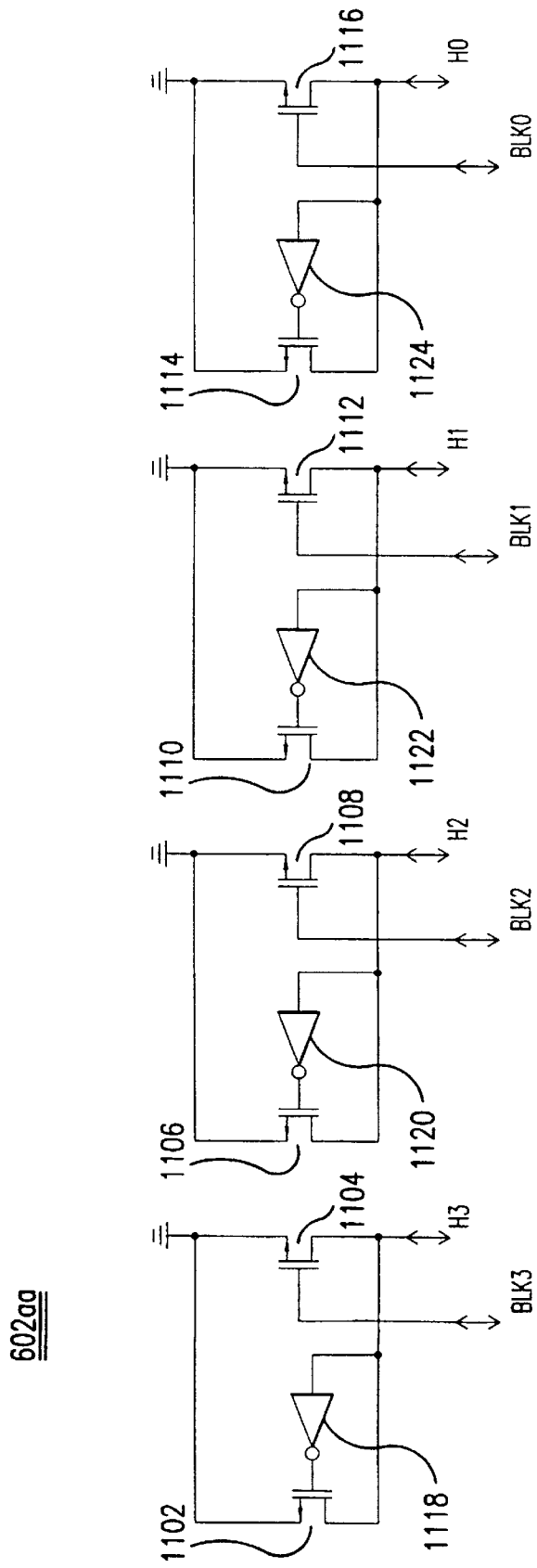
FIGS. 11A–11C show precharge circuits of the priority encoder of FIG. 6A.

FIG. 11A shows passgate circuit 602aa in detail, which comprises n-channel transistors 1102–1116 and inverters 1118–1124, coupled as shown in FIG. 11A. The purpose of passgate circuit 602aa is to "pass," according to the active one of signals F0–F3, the value of a single one of the bus group members which are coupled to H0–H3, while forcing to ground all other bus group members which are coupled to H0–H3. Thus, for example, if F3 is active (low), the members coupled to H0–H2 will be driven to ground, while the member coupled to H3 will be "passed," i.e., driven as dictated by the quadrant circuit Q3 which drives that member. Advantageously, a partial latching effect is provided to member H3 by means of a half-latch formed by n-channel transistor 1102 and inverter 1118.

Passgate/OR circuit 602a further comprises NOR gates 602ab and 602ac, and a NAND gate 602ad coupled as shown in FIG. 6D to generate, at the output of NAND gate 602ad, a signal that is simply the logical OR function of the four inputs to NOR gates 602ab and 602ac. The output of NAND gate 602ad is coupled to bus group BG54 member A5BA4B. Due to other priority encoder 600 circuitry to be described infra which drives feedback signals F0–F3, only one of the active-high input members A5BA4B_Q3, A5BA4B_Q2, A5BA4B_Q1, and A5BA4B_Q0 can be active at a given time. For this reason, and for clarity of disclosure, the term "member A5BA4B of bus group BG54" will interchangeably refer to any one of the members A5BA4B_Q3, A5BA4B_Q2, A5BA4B_Q1, and A5BA4B_Q0.

Passgate/OR circuits 602b–d and 604a–d are identical in structure to the passgate/OR circuit 602a with respect to their respective bus group members. While the passgate/AND circuits 606a–d each differ from the passgate/OR circuit 602a in that the members of bus group BG10 are active low, they otherwise perform the a similar "gating" function by ensuring that the bus group BG10 is driven according to that one of bus groups BG10_Q0, BG10_Q1, BG10_Q2, and BG10_Q3 which corresponds to the lowest active quadrant.

As shown in FIG. 6D, an exemplary passgate/AND circuit 606a comprises a passgate circuit 606aa, NAND gates 606ab and 606ac, and NOR gate 606ad. Passgate circuit 606aa comprises four input/output nodes K3, K2, K1, and K0. Passgate circuit 606aa further comprises feedback inputs BLK0, BLK1, BLK2, and BLK3. As shown in FIG. 6D, input/output nodes K3, K2, K1, and K0 of passgate 606aa are coupled respectively to quadrant bus group members A1BA0B_Q3, A1BA0B_B2, A1BA0B_Q1, and A1BA0B_Q0. Also as shown in FIG. 6D, feedback inputs BLK0, BLK1, BLK2, and BLK3 are coupled to signals F0, F1, F2, and F3, respectively, which are provided by the quadrant circuits Q0, Q1, Q2, and Q3.

Figure 11B:
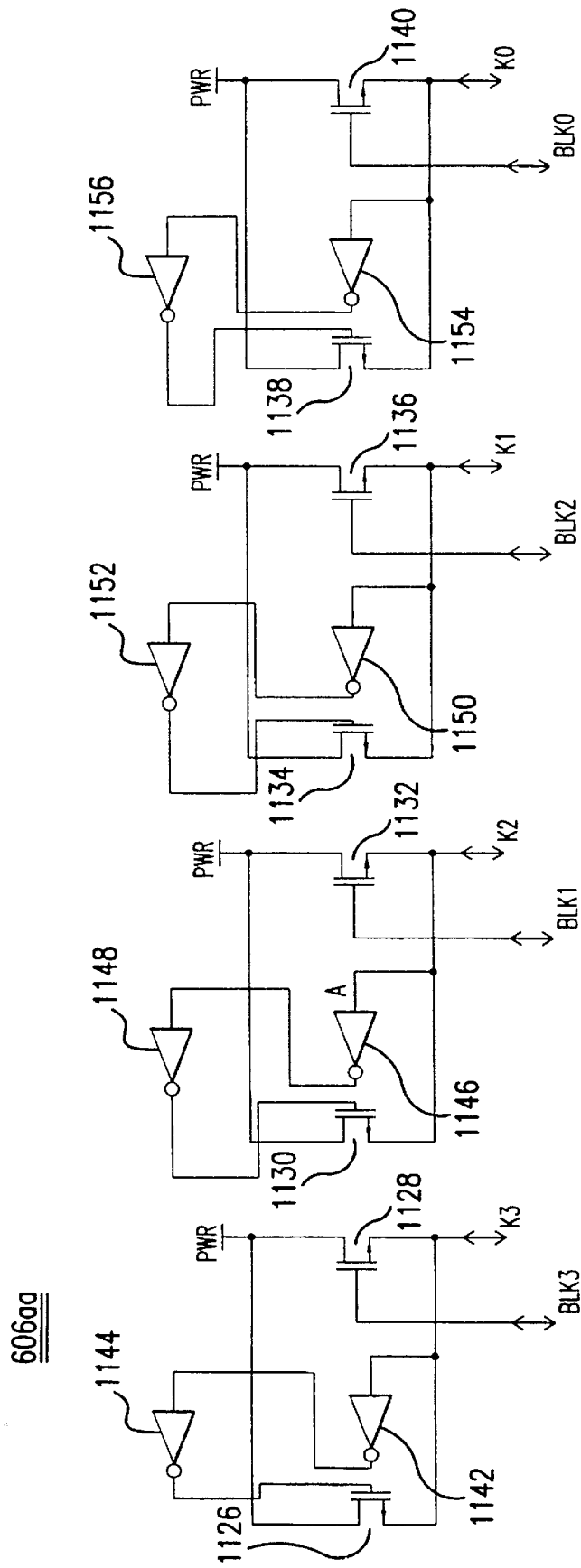

FIG. 11B shows passgate circuit 606aa in detail, which comprises n-channel transistors 1126–1140 and inverters 1142–1156 coupled as shown in FIG. 11B. The purpose of passgate circuit 606aa is to "pass," according to the active one of signals F0–F3, the value of a single one of the bus group members which are coupled to K0–K3, while forcing to Vdd all other bus group members which are coupled to K0–K3. Thus, for example, if F1 is active (i.e., low), the members coupled to K0, K2, and K3 will be driven to Vdd, while the member coupled to K1 will be "passed," i.e., driven as dictated by the quadrant circuit Q3 which drives that member. Advantageously, a partial latching effect is provided to member K1 by means of a half-latch formed by n-channel transistor 1134 and inverters 1150 and 1152.

Passgate/AND circuit 606a further comprises NAND gates 606ab and 606ac and a NOR gate 606ad coupled as shown in FIG. 6D. Keeping in mind that the members of bus group BG10 are active low, this circuit configuration generates, at the output of NOR gate 606ad, a signal that is the logical AND function of the four inputs to NAND gates 606ab and 606ac. The output of NOR gate 606ad is coupled to bus group BG10 member A1BA0B. Due to other priority encoder 600 circuitry to be described infra which drives feedback signals F0–F3, only one of the active-low input members A1BA0B_Q3, A1BA0B_Q2, A1A0B_Q1, and A1BA0B_Q0 can be active at a given time. For this reason, and for clarity of disclosure, the term "member A1BA0B of bus group BG10" will interchangeably refer to any one of the members A1BA0B_Q3, A1BA0B_Q2, A1A0B_Q1, and A1BA0B_Q0.

Without loss of generality or accuracy, this disclosure will simply refer to overall bus groups BG54, BG32, and BG10 when referring to bus groups or bus group members, for clarity of disclosure. It is understood that, except during transition periods when the match lines may still be settling, only one of the quadrants Q0–Q3 is ever driving its lower order bus groups corresponding to address bits A5–A0.

Figure 1:
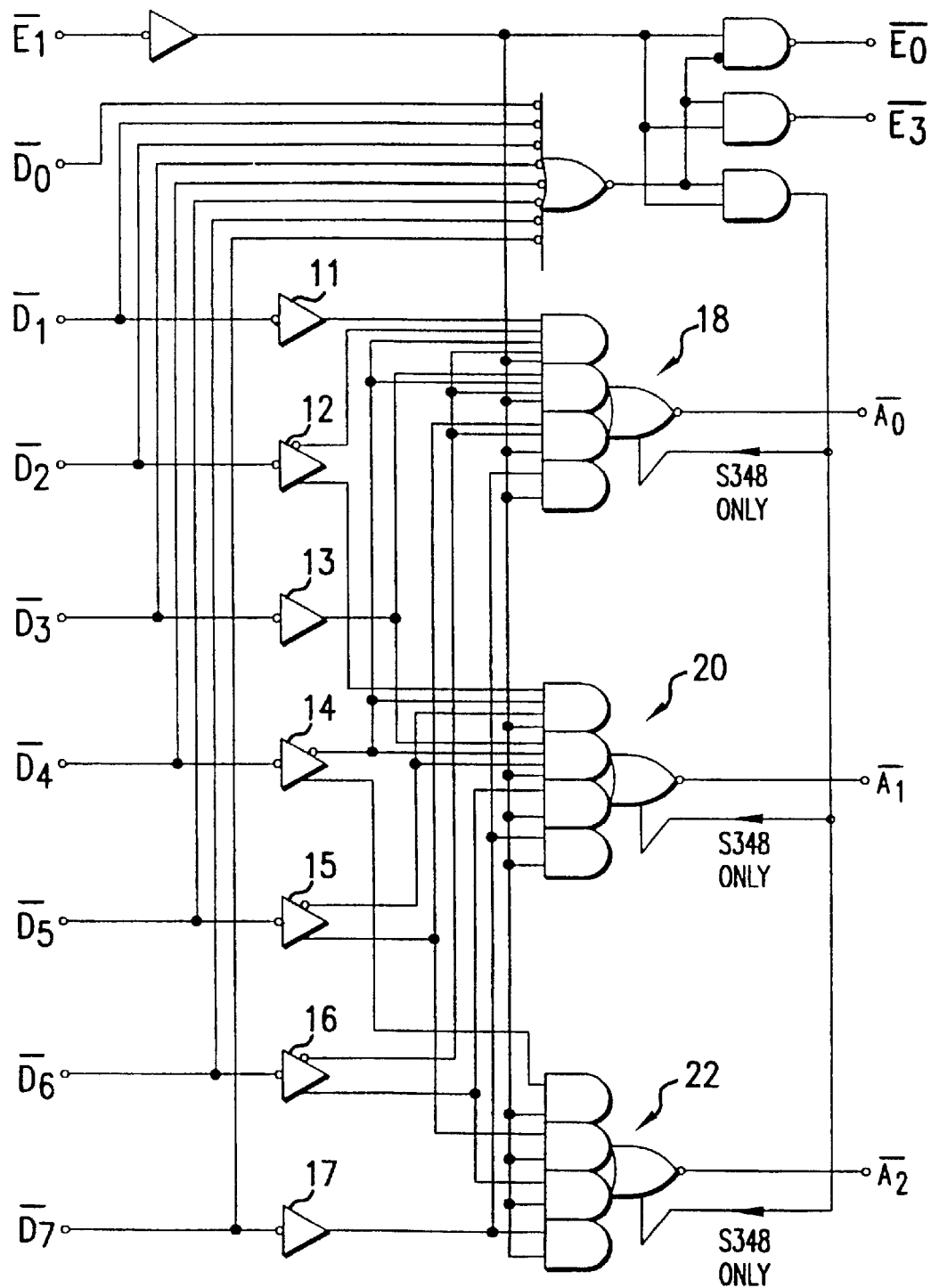
FIG. 1 shows a priority encoder according to the prior art using purely combinatorial logic without feedback.
Figure 2A:
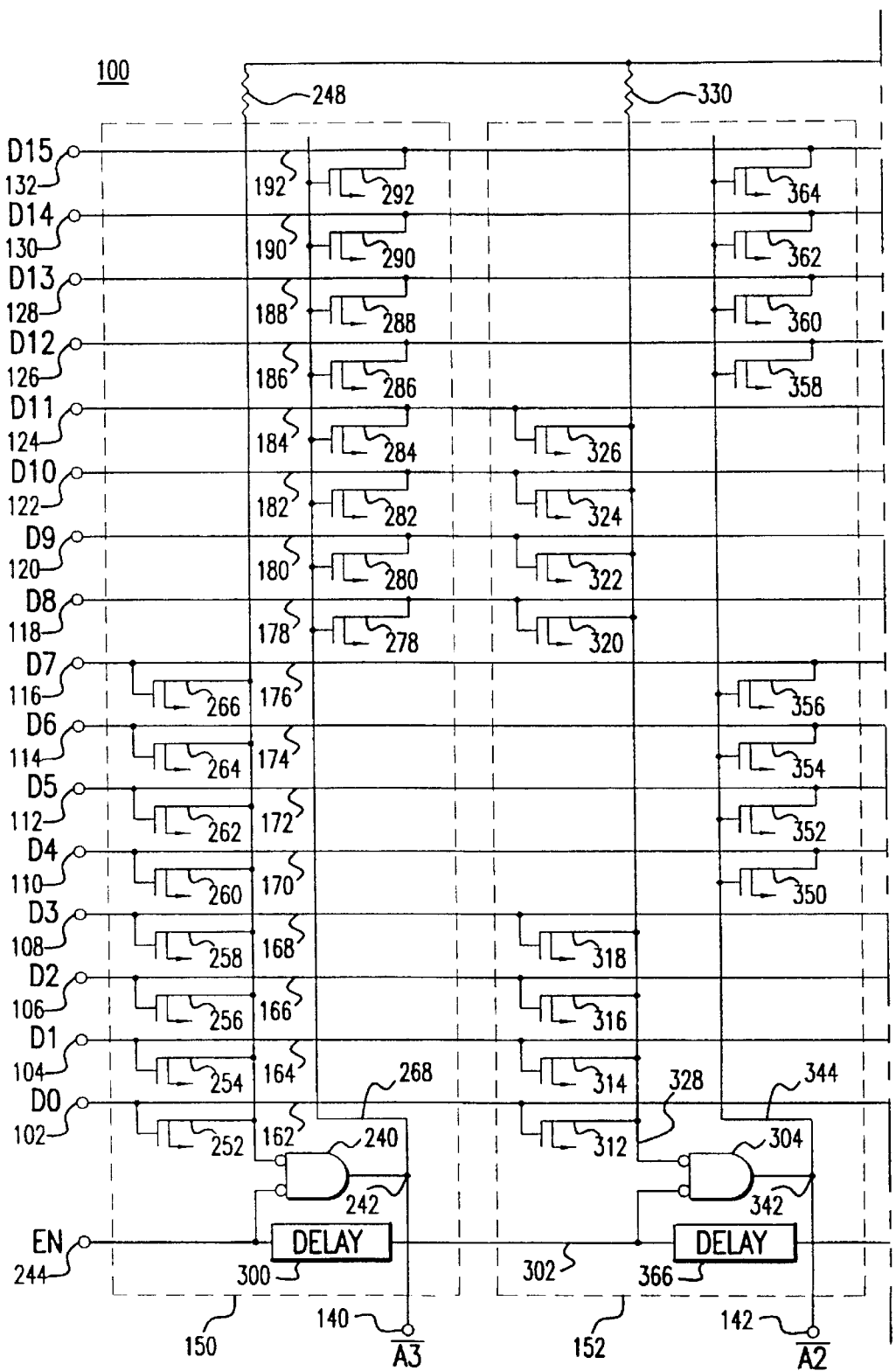
FIG. 2 shows a priority encoder 100 according to the prior art using delay lines and having feedback.
Figure 2B:
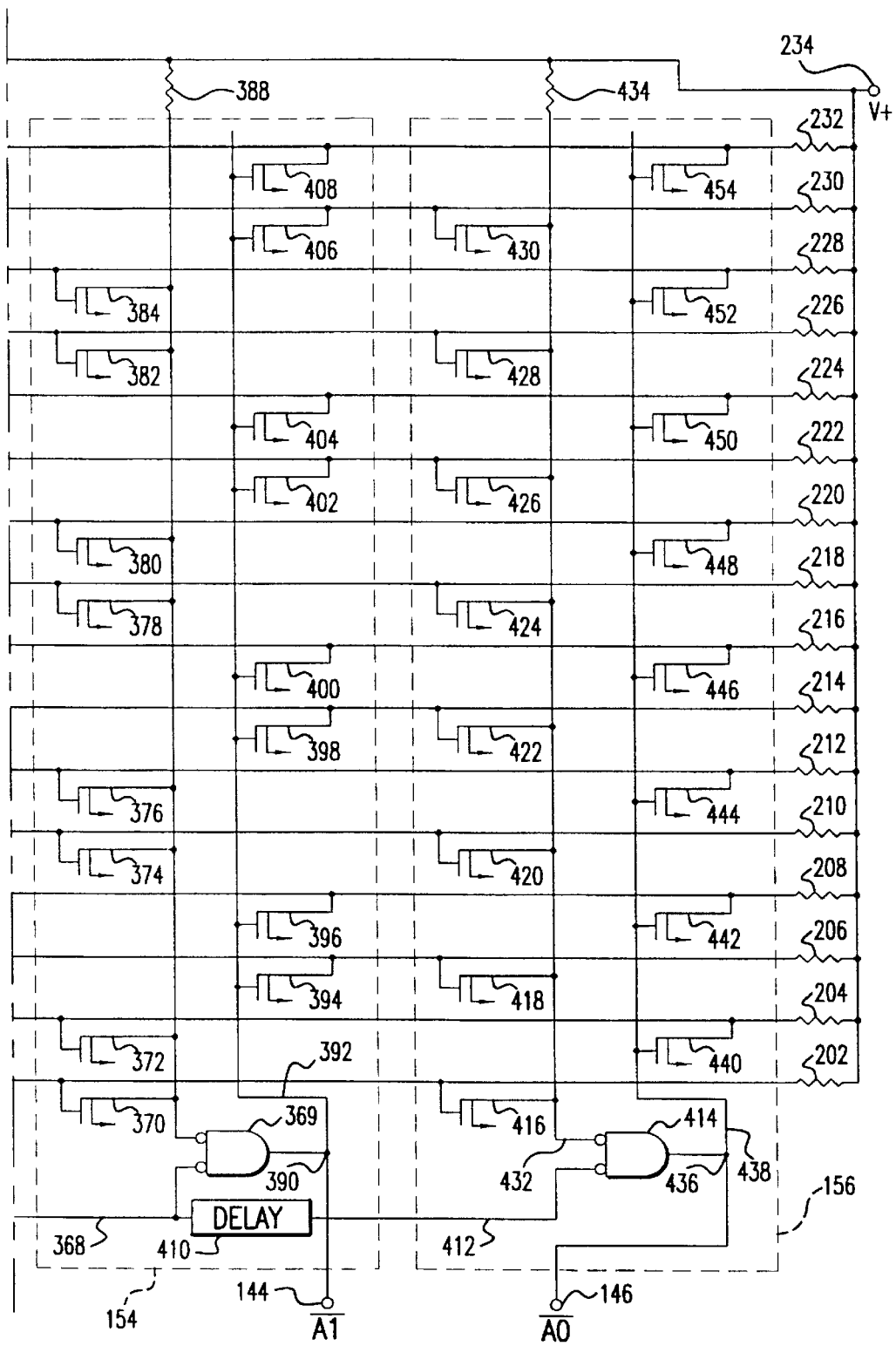
Figure 11C:
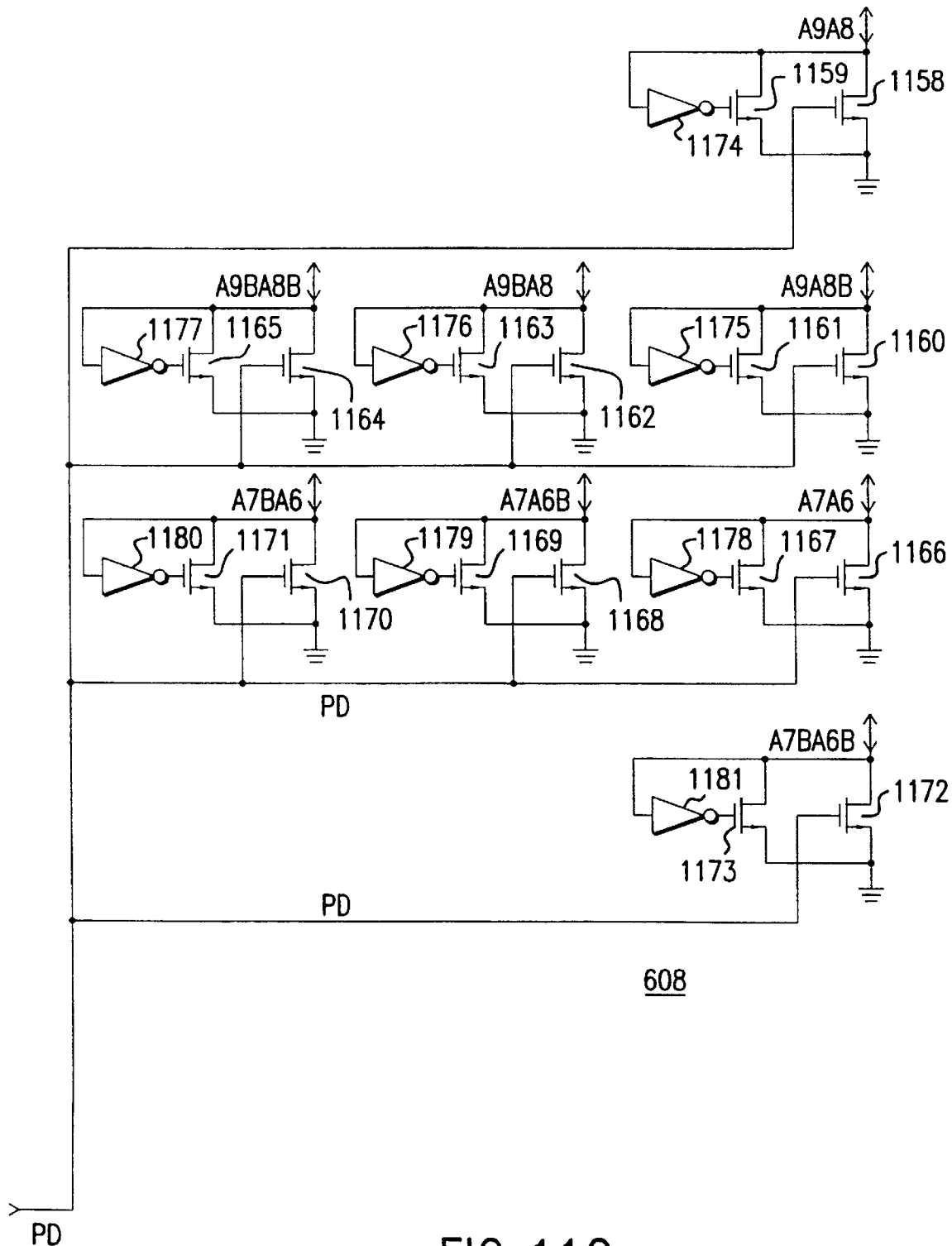

Priority encoder 600 further comprises a precharge circuit 608 for precharging the values of the members of bus group BG98 and bus group BG76 according to a signal PD. Precharge circuit 608 is shown in detail at FIG. 1C, and comprises n-channel transistors 1158–1173 and inverters 1174–1181 coupled as shown in FIG. 11C for precharging each member of the bus groups BG98 and BG76 to low when enable signal PD is high, and for releasing these members into a high impedance state when enable signal PD is low.

In a preferred embodiment, the signal PD is generated by CAM circuitry not shown to be high when the priority encoder 600 is inactive, such as when operations other than matching operations are taking place in the CAM, or when matching operations are taking place and the match lines have not settled. The signal PD is then driven low to allow the priority encoder 600 to appropriately drive the output address lines A9–A0.

A priority encoder according to a preferred embodiment can reliably generate an output address approximately 15 ns after the match lines have settled and PD is driven low. In a typical use, if matches are taking place during each CAM cycle, the signal PD is periodic and remains high for 55 ns and low for 15 ns. Also in a typical use, the system using the CAM circuit comprises buffer or locking circuitry capable of locking the values of output address lines A9–A0 onto a second set of output address lines A9'–A0' almost instantaneously. Using this circuitry, the CAM system locks the A9–A0 priority-encoded address onto the output address lines A9'–A0' at a time when the address A9–A0 is guaranteed to be reliable (e.g. at around 14 ns after PD is driven low). The remainder of the system using the CAM then uses the priority-encoded address on lines A9'–A0' until it is renewed in the next cycle.

Importantly, the precharge circuit 608 is not necessary for proper operation of the priority encoder 600, and the priority encoder 600 may run in a purely asynchronous manner. In this other preferred embodiment, the precharge circuit 608 is completely omitted from the design or is effectively removed from the circuit by wiring the PD signal to low. In this case, the priority encoder runs in a purely asynchronous manner. Once all the match lines have settled at a time $t_0$, the priority-encoded output address will appear on output address lines A9–A0 after a time $t_0+t_{encode}$. After the time $t_0+t_{encode}$, and before the match lines are changed, the priority-encoded address may be locked onto the output lines A9'–A0' by the locking circuitry described above. The predetermined interval $t_{encode}$ should be chosen to exceed the maximum response time of the priority encoder 600, which is generally approximately 15 ns but which may be as little as 11 ns using current semiconductor technology.

Priority encoder 600 further includes conversion circuits 610, 612, 614, 616, and 618 for driving the values of their respective address bit outputs responsive to the state of the respective members of bus groups BG98, BG76, BG54, BG32, and BG10. The structure and operation of conversion circuits 610, 612, 614, and 616 are similar to that of conversion circuit 350 of FIG. 3 and are designed to encode signals on active high bus groups. Conversion circuit 618 is similar in structure and operation to conversion circuit 360 of FIG. 3, being designed for encoding signals on an active low bus group.

Figure 6E:
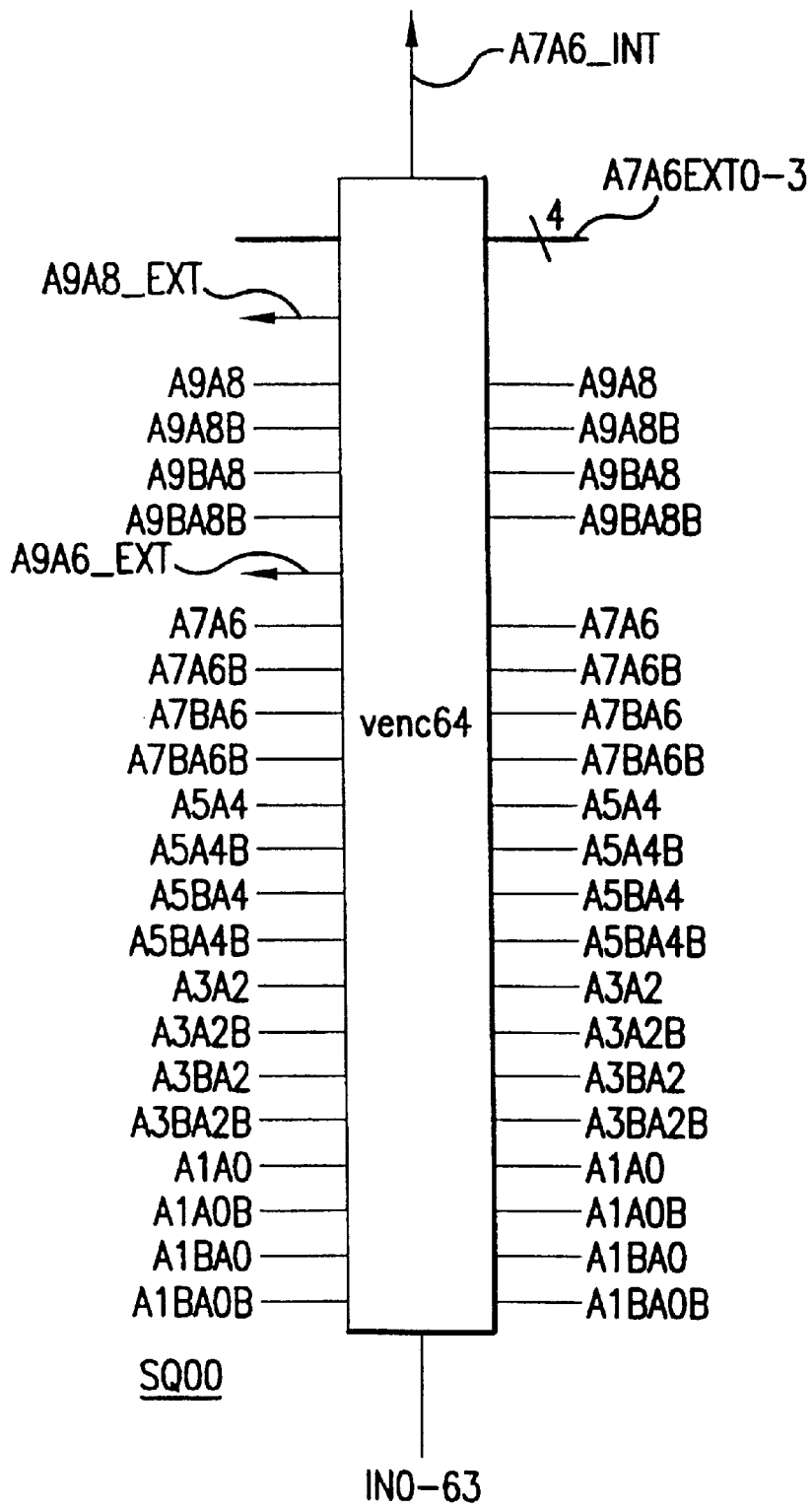

The priority encoder 600 is now described in terms of the highest order logic circuit for driving bus group BG98 and output address lines A9 and A8. Referring now to FIGS. 6A, 6B, and 6E there is shown quadrant circuit Q0 comprising substantially identical subquadrant circuits SQ00, SQ01, SQ02, and SQ03. FIG. 6E shows a close up view of the lines entering and exiting a subquadrant circuit SQ00, these lines generally being the bus group lines BG98, BG76, BG54, BG32, and BG10. Shown in FIG. 6E is the subquadrant circuit SQ00 having inputs at input lines IN0–IN63 and having output lines at nodes A7A6__EXT, A9A8__EXT, and A7A6__INT.

The circuit diagram of subquadrant circuit SQ00 will be described infra. However, for purposes of disclosing the highest order logic circuit it will be noted only that subquadrant circuit SQ00 drives line A7A6__INT with the logical NOR of inputs IN0–IN63 if IN0–IN63 are active high signals, or alternatively the to logical AND of inputs IN0–IN63 if they are active low. As used herein, it will be assumed that the inputs IN0–IN1023 are active high inputs, and thus subquadrant circuit SQ00 drives line A7A6__INT with the logical NOR of inputs IN0–IN63.

As shown in FIG. 6B, the outputs A7A6__INT of subquadrant circuits SQ00–SQ03 are coupled to four inputs of a NAND gate 614, NAND gate 614 having an output at a node QD0. Node QD0 is driven high whenever at least one of the inputs IN0–255 is active and low otherwise, and therefore serves as a quadrant detect signal. Node QD0 is coupled to the input of an inverter 616, which has an output coupled to a first input of a NOR gate 618. The node PD is coupled to a second input of NOR gate 618, NOR gate 618 having an output coupled to the member A9BA8B of bus group BG98. Accordingly, assuming that PD is active, i.e., is driven to a low state, the member A9BA8B will be driven high when there is an active input line among lines IN0–IN255. As described previously, conversion circuit 610 will then drive output address lines A9 and A8 to A9=0 and A8=0. This is the desired result, as the 10-bit address of any input line in the range IN0–IN255 has A9=0 and A8=0. Conversely, if none of the input lines IN0–255 are active, member A9BA8B will be driven low. In such a case, the bus group BG98 will be driven to one of the other possible states of A9 and A8 as determined by other quadrant detect signals generated by quadrants Q1, Q2, or Q3, depending on the states of other input lines IN256–1023.

Importantly, in the preferred embodiment described supra in which the precharge circuit 608 is omitted or disabled by clamping PD to ground, the quadrant circuit Q0 still operates as desired. This is because the NOR gate 618 simply operates as an inverter when the PD node is clamped to ground, and thus the quadrant detect signal QD0 is always fed back to bus group member A9BA8B, as desired. Thus, as described previously, the priority encoder 600 is capable of fully asynchronous operation.

As shown in FIG. 6B, the signal QD0 is inverted by inverter 616 to form a feedback signal F0. Because the quadrant detect signal QD0 is active high, the feedback signal F0 is active low. Thus, the feedback signal F0 is low (active) when there exists an active match line in the first quadrant of input lines IN0–IN255, and is high (inactive) otherwise. The feedback signal F0 is used to drive the lower order passgate circuits 602*aa–da*, 604*aa–da*, and 606*aa–da* as described supra with respect to FIG. 6D.

The signal QD0 at the output of NAND gate 614 is also coupled to the input of an inverter 620, the inverter 620 having an output coupled to a first input of a NAND gate 622. FIG. 6B also shows subquadrant circuits SQ10, SQ11, SQ12, and SQ13 which are coupled in a manner similar to that described for subquadrant circuits SQ00–03 in quadrant circuit Q0. In particular, subquadrant circuits SQ10–13 each comprise outputs A7A6__INT which are coupled to the four inputs of a NAND gate 624, the NAND gate 624 having an output at a quadrant detect node QD1. The node QD1 is coupled to a second input of NAND gate 622, the NAND gate 622 having an output coupled to a first input of a NOR gate 626. The NOR gate 626 has an output coupled to member A9BA8 of bus group BG98. Accordingly, the bus group member A9BA8 is driven to (QD1●$\overline{QD0}$●$\overline{PD}$). Given that PD is an active low signal, this signifies that the member A9A8B will be driven high if (1) the priority encoder 600 is active (PD is low), (2) there is no active input line in the quadrant IN0–255, and (3) there is an active input line in the quadrant IN256–511. With regard to the discussion related to the priority encoder 300 of FIG. 3, in particular with respect to Table 1, this is the desired result.

As shown in FIG. 6B, the signal at the output of NAND gate 622 is a feedback signal F1 which is equal to (QD1●QD0). Accordingly, the feedback signal F1 is low (active) when (1) there is no active match line in the quadrant IN0–255, and (2) there exists an active match line in the second quadrant of input lines IN256–IN511. Otherwise, the feedback signal F1 is high (inactive). The feedback signal F1 is used to drive the lower order passgate circuits 602*aa–da*, 604*aa–da*, and 606*aa–da* as described supra with respect to FIG. 6D.

As shown in FIG. 6C, priority encoder 600 comprises subquadrant circuits SQ20, SQ21, SQ22, and SQ23 in quadrant Q2 having the same characteristics as those subquadrant circuits discussed supra. In a manner similar to the generation of quadrant detect signals at nodes QD0 and QD1, a quadrant detect signal at a node QD2 is driven high responsive to the presence of an active input at inputs IN512–IN767. The node QD2, which is coupled to the output of a NAND gate 628, is coupled to a first input of a NAND gate 630. NAND gate 630 further comprises a second input coupled to the output of inverter 620, and a third input coupled to the output of an inverter 632, the inverter 632 having an input coupled to the node QD1. NAND gate 630 has an output coupled to a first input of a NOR gate 634, the NOR gate 634 having a second input coupled to the node PD. The NOR gate 634 has an output coupled to member A9A8B of bus group BG98. Accordingly, member A9A8B is driven to the boolean function (QD2●QD1●QD0●PD). Therefore, the member A9A8B will be driven high if (1) the signal PD is low, (2) if none of the input lines IN0–IN511 are active, and (3) at least one of the inputs IN512–767 is active. If none of the members IN0–IN767 are active, A9A8B will be driven to zero. As shown in Table 1, this is the desired result for bus group BG98 for driving the appropriate values of A9 and A8.

As shown in FIG. 6C, the signal at the output of NAND gate 630 is a feedback signal F2 which is equal to (QD2●QD1●QD0). Accordingly, the feedback signal F2 is low (active) when (1) there is no active match line in the first two quadrants IN0–511, and (2) there exists an active match line in the third quadrant of input lines IN512–IN767. Otherwise, the feedback signal F2 is high (inactive). The feedback signal F2 is used to drive the lower order passgate circuits 602*aa–da*, 604*aa–da*, and 606*aa–da* as described supra with respect to FIG. 6D.

FIG. 6C shows subquadrant circuits SQ30, SQ31, SQ32, and SQ33 contained in quadrant Q3 and receiving input lines IN768–1023 in a manner similar to those for quadrants Q0–Q2. A quadrant detect signal at a node QD3 is driven at an output of a NAND gate 636, and is driven high when at least one of input lines 768–1023 is active. Node QD3 is coupled to a first input of a NAND gate 638, the NAND gate 638 having a second input coupled to the output of an inverter 640, the inverter 640 having an input coupled to node QD2. NAND gate 638 further comprises a third input coupled to the output of inverter 632 and a fourth input coupled to the output of inverter 620. The output of NAND gate 638 is coupled to a first input of a NOR gate 642, the NOR gate 642 having a second input coupled to node PD. NOR gate 642 has an output coupled to member A9A8 of bus group BG98. Accordingly, the member A9A8 is driven to the boolean function of (QD3●QD2●QD1●QD0●PD). Accordingly, member A9A8 is driven high when (1) the signal PD is low, (2) when no input lines IN0–767 are active, and (3) when at least one of the input lines IN768–1023 is active. With reference to Table 1, this yields the desired result for appropriately driving output bits A9 and A8.

As shown in FIG. 6C, the signal at the output of NAND gate 638 is a feedback signal F3 which is equal to (QD3●QD2●QD1●QD0). Accordingly, the feedback signal F3 is low (active) when (1) there is no active match line in the first three quadrants IN0–767, and (2) there exists an active match line in the fourth quadrant of input lines IN768–IN1023. Otherwise, the feedback signal F3 is high (inactive). The feedback signal F3 is used to drive the lower order passgate circuits 602*aa–da*, 604*aa–da*, and 606*aa–da* as described supra with respect to FIG. 6D.

Priority encoder 600 further comprises a NAND gate 644 and an inverter 646 coupled as shown in FIG. 6C such that the output of NAND gate 644 is equal to the logical OR of all 1024 input lines. This is achieved by coupling nodes containing the compliments of the signals QD0, QD1, QD2, and QD3 to four inputs of the NAND gate 644. The output of NAND gate 644, which is at a node RD, is coupled to a first input of a NOR gate 648, the NOR gate 648 having a second input coupled to the node PD and an output coupled to a node MF. The signal at node MF is high when the circuit is enabled according to the low value of node PD and when at least one of input lines IN0–IN1023 is active. Advantageously, when priority encoder 600 is used in conjunction with a CAM, the signal at node MF can be used as a match flag for driving other parts of an integrated circuit containing the priority encoder 600.

It is to be appreciated that the previous comments made with respect to NOR gate 618 with respect to the signal PD also apply to the NOR gates 626, 634, 642, and 648. In particular, in the preferred embodiment described supra in which the precharge circuit 608 is omitted or disabled by clamping PD to ground, the quadrant circuits Q1–Q3 still operate as desired. Thus, as described previously, the priority encoder 600 is capable of fully asynchronous operation.

The operation and structure of priority encoder 600 with respect to bus group BG76 is now described. It is noted that only the operation and structure of quadrant Q0 will be discussed, since the structures of quadrants Q1, Q2, and Q3 are advantageously identical with respect to the driving of bus groups BG76, BG54, BG32, and BG10 as the quadrant Q0. Indeed, a priority encoder according to the preferred embodiment is advantageously amenable to large numbers of inputs because it allows for replication of identical circuit portions using CAD/CAM techniques known in the art. This type of circuit duplication extends downward. In other words, with respect to the driving of bus group BG54, only one of the subquadrant circuits SQ00–03 needs to be described, and with respect to bus group BG32, only one section of SQ00 needs to be described.

Referring now to FIGS. 6A, 6B, and 6D, each of the subquadrant circuits SQ00–SQ03 comprises a node A7A6__EXT and a node A9A8__EXT. Each subquadrant circuit SQ00–SQ03 also comprises the four lines A7A6EXT0–3 which couple to all subquadrant circuits of the priority encoder 600, as shown in FIG. 6A. Priority encoder 600 further comprises an A7A6__SEL circuit 650 associated with quadrant Q0, an A7A6__SEL circuit 652 corresponding to quadrant Q1, an A7A6__SEL circuit 654 corresponding to quadrant Q2, and an A7A6__SEL circuit 656 corresponding to quadrant Q3. In accordance with the duplicated nature of the quadrants, the elements 650, 652, 654, and 656 are duplicates of each other and therefore only element 650 will be described.

A7A6__SEL circuit 650 comprises an input node B98__IN, nodes A9A8EXT0–3 coupled to corresponding nodes A9A8__EXT at each of subquadrant circuits SQ00–03, respectively, and nodes A7A6EXT0–3 coupled to corresponding nodes A7A6__EXT of each of subquadrant circuits SQ00–03, respectively. Importantly, as shown in FIGS. 6B and 6C, the nodes A9A8EXT0–3 for the corresponding elements 652, 654, and 656 of the other quadrant circuits Q1–Q3 are separately coupled to their respective subquadrant circuits SQ10–13, SQ20–23, and SQ30–33. Thus, for example, the node A9A8EXT2 of element 654 (quadrant Q1) is not coupled to the node A9A8EXT2 of element 656 (quadrant Q2) because of the separate coupling. In contrast, the nodes A7A6EXT0–3 are commonly coupled and form a common bus A7A6EXT0–3 which is common to all quadrants Q0–A3.

For quadrant Q0, the input node B98__IN of A7A6__SEL circuit 650 is coupled to bus group member A9BA8B of bus group BG98. In contrast, for quadrant Q1, the input node B98__IN of A7A6__SEL circuit 652 is coupled to bus group member A9BA8 of bus group BG98. In turn, for quadrants Q2 and Q3, the input nodes B98__IN of A7A6__SEL circuits 654 and 656 are coupled to bus group members A9A8B and A9A8, respectively, of bus group BG98.

Figure 7:
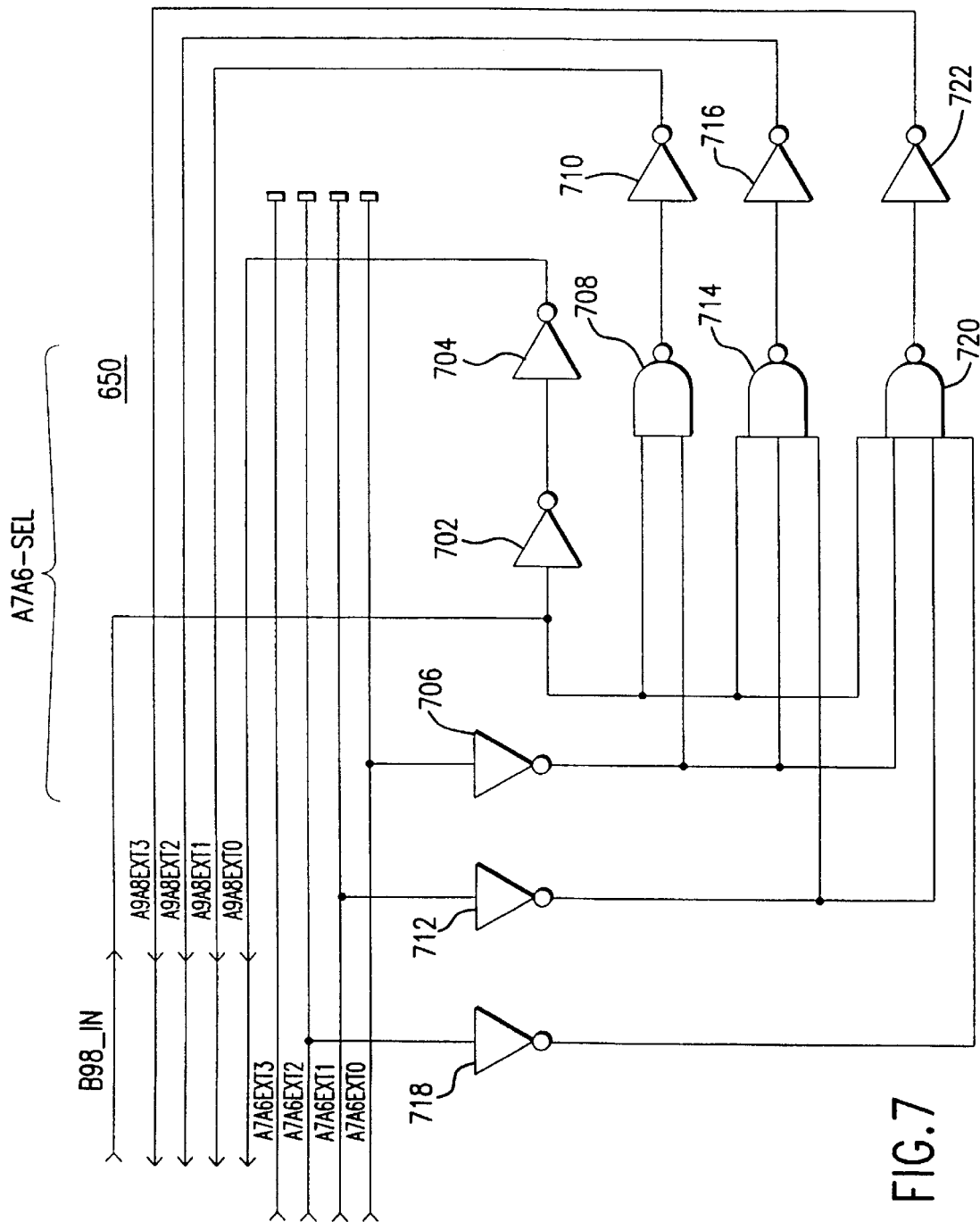
FIG. 7 shows a portion A7A6_SEL of a quadrant circuit of the priority encoder of FIG. 6A.

FIG. 7 shows A7A6__SEL circuit 650 in detail. A7A6__SEL circuit 650 comprises inverters 702 and 704 coupled in series between nodes B98__IN and A9A8EXT0, the node B98__IN also being coupled to a first input of each of NAND gates 708, 714, and 720. A7A6__SEL circuit 650 further comprises inverters 706, 710, 712, 716, 718, and 722 and NAND gates 708, 714, and 720, coupled as shown in FIG. 7. Importantly, each of the nodes A7A6EXT0–3 terminates in an open circuit at the right hand side of FIG. 7, and is not coupled to ground or Vdd through terminating resistors.

Figure 8A:
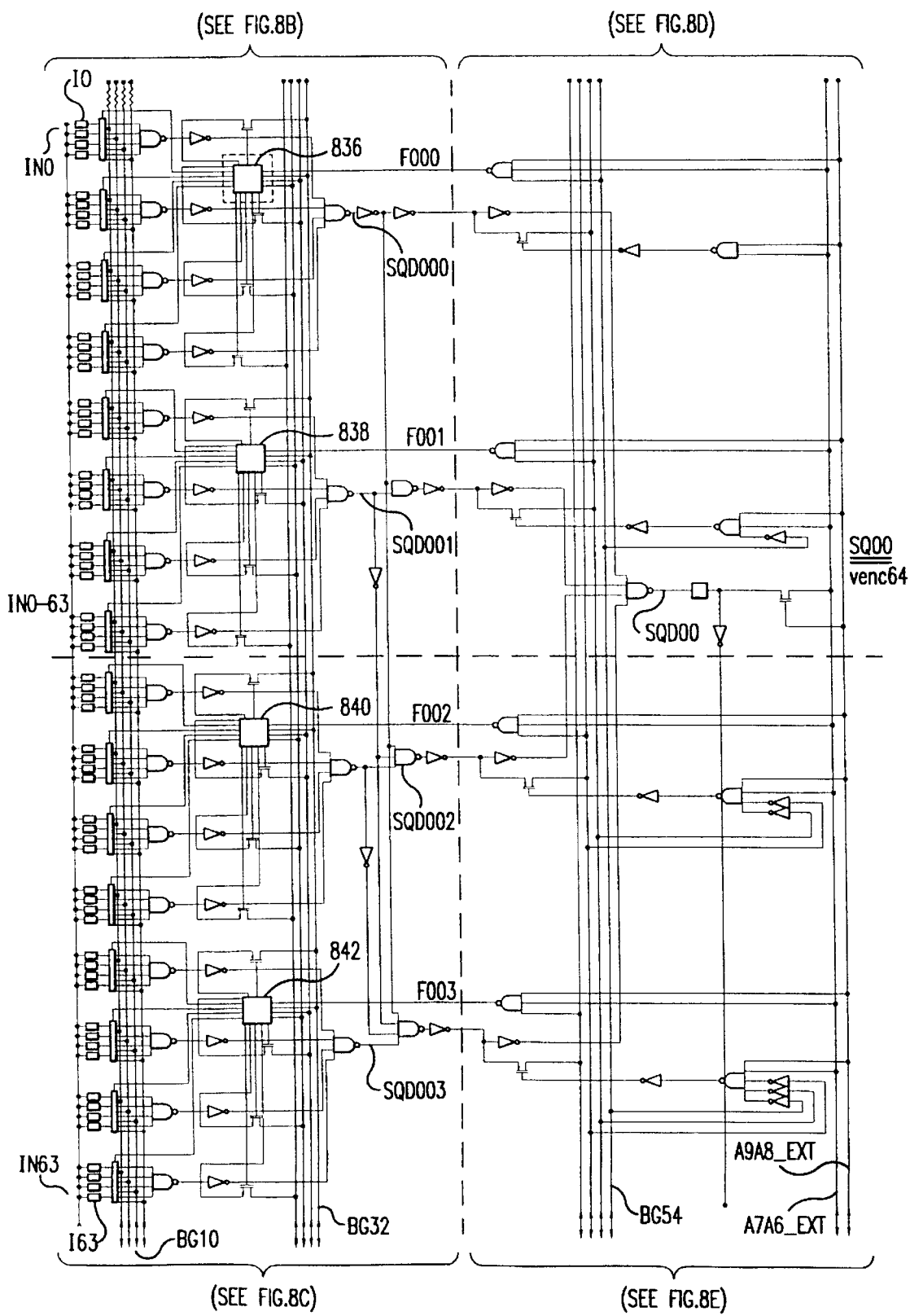
Figure 8B:
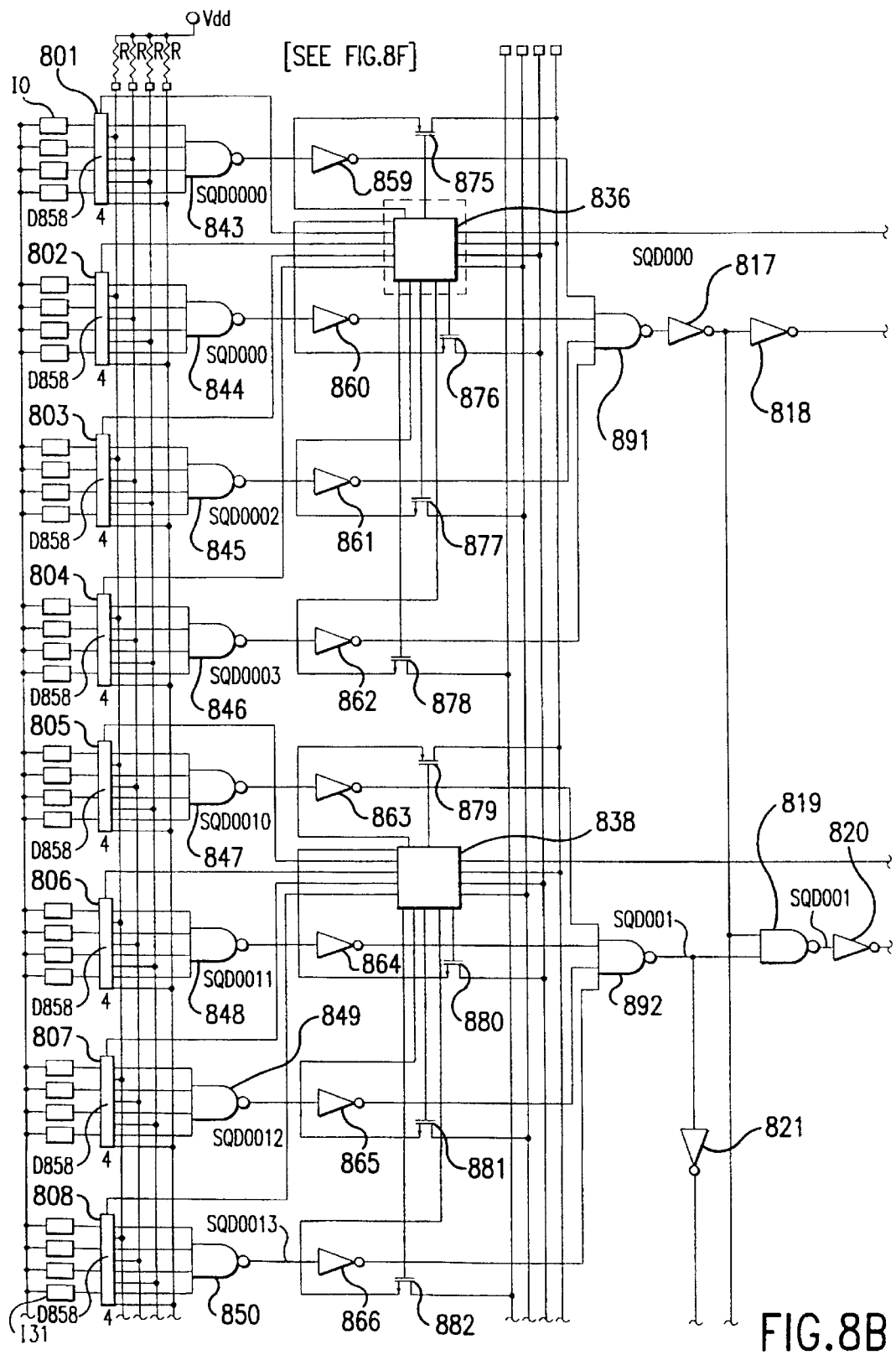
Figure 8C:
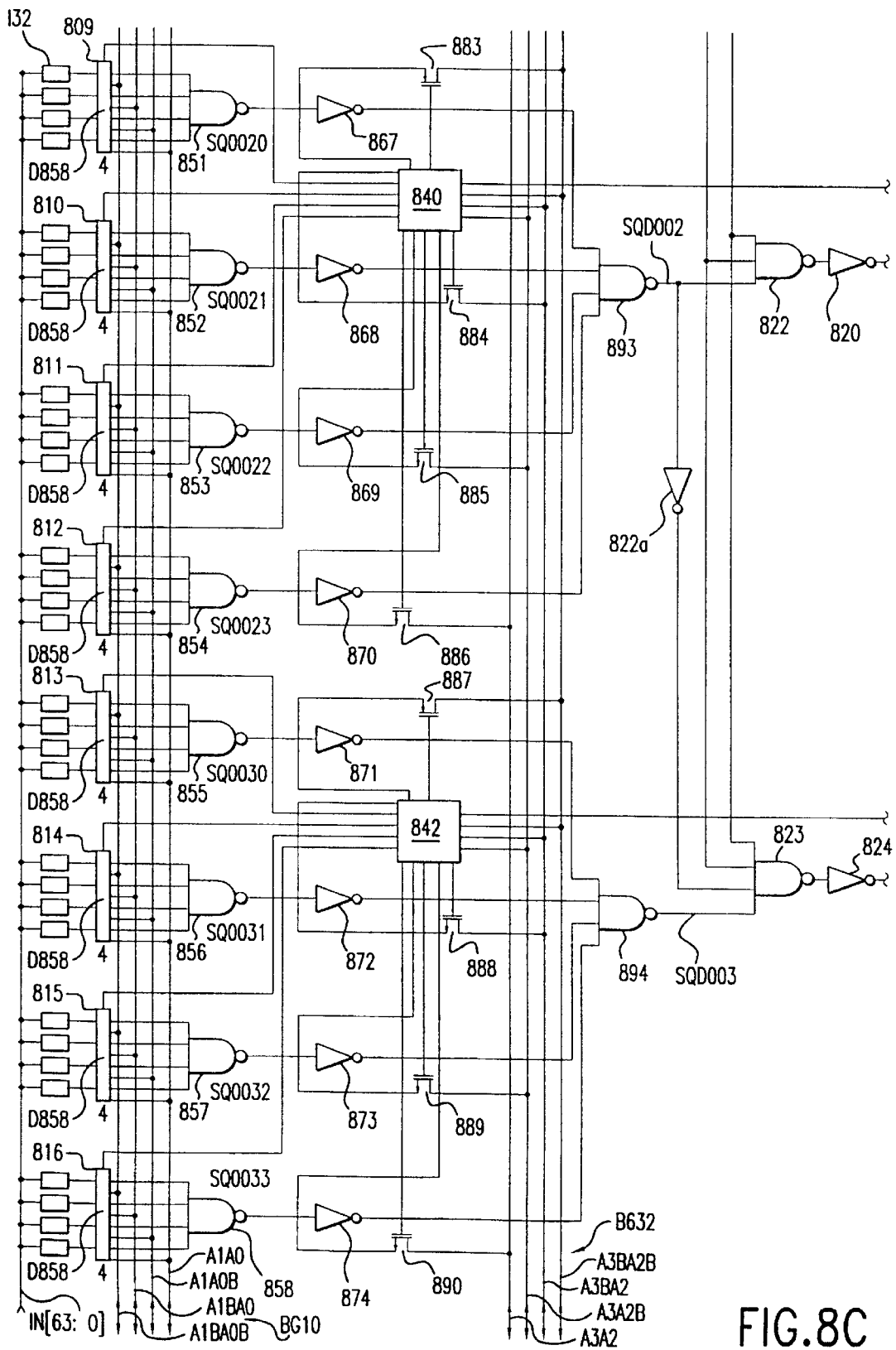
Figure 8D:
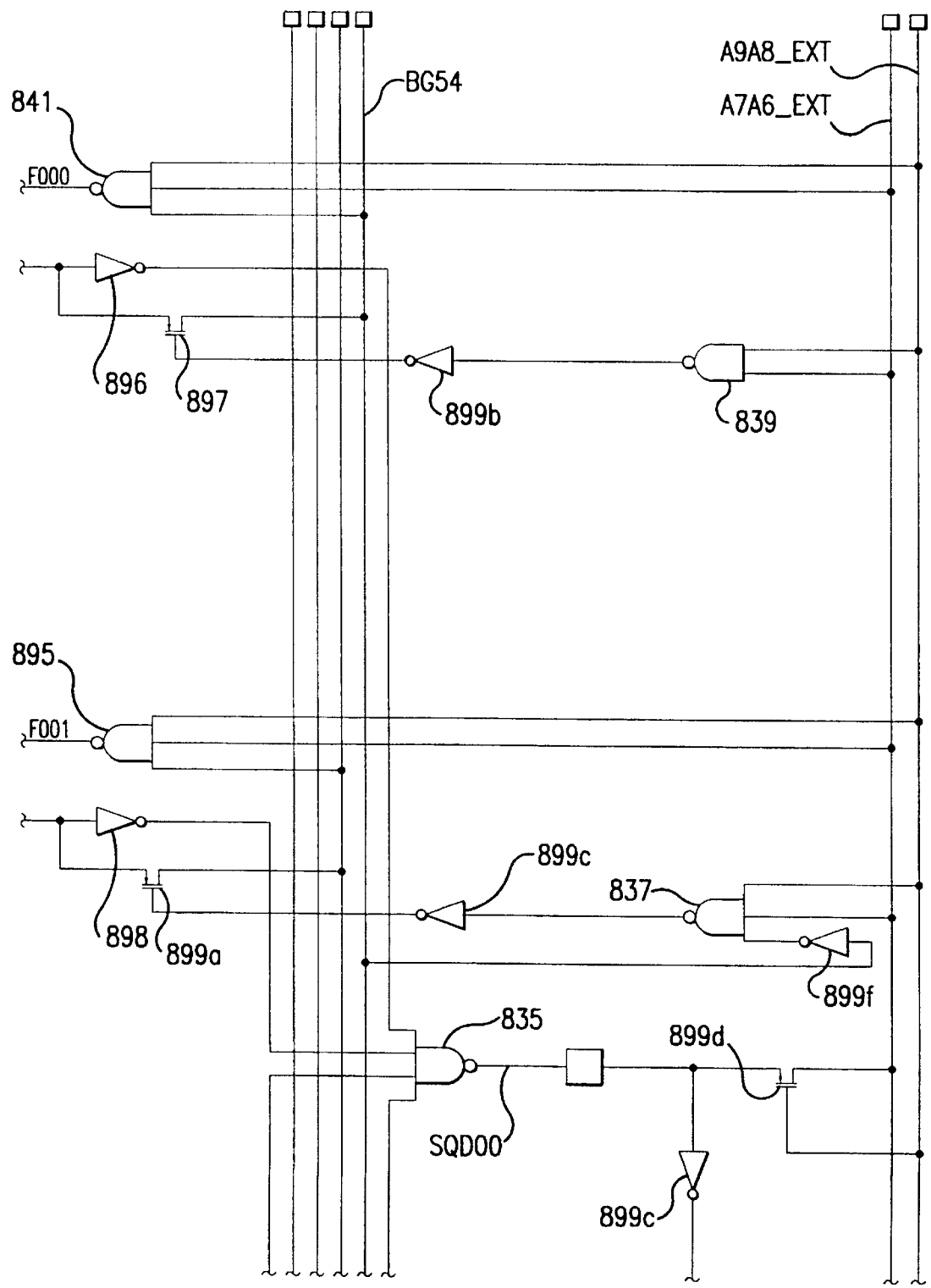
Figure 10:
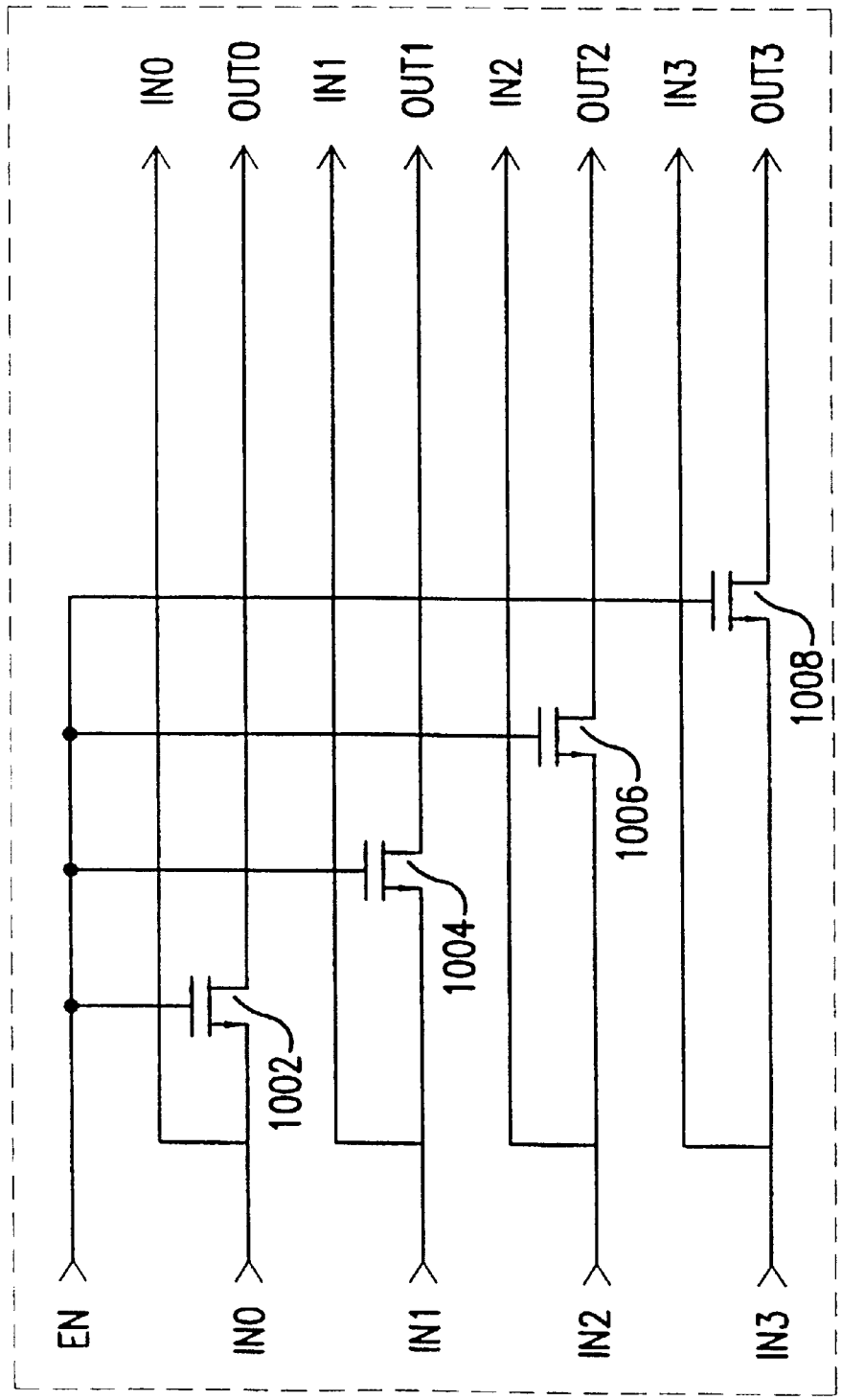
FIG. 10 shows a portion of a lowest order logic circuit of the priority encoder of FIG. 6A.

FIG. 8A shows in detail the subquadrant circuit SQ00 associated with quadrant Q0. Advantageously, the subquadrant circuit SQ00 is identical in structure to the subquadrant circuits SQ01–03, and thus only the operation of subquadrant circuit SQ00 will be described. Subquadrant circuit SQ00 comprises 64 inputs IN0–IN63 for receiving request signals, and inverters I0–I63 coupled between the inputs IN0–IN63 and lowest level circuits 801–816, as shown in FIGS. 8B and 8C. A lowest level circuit 801 is shown in FIG. 10 and comprises switch transistors 1002, 1004, 1006, and 1008 coupled between inputs IN0–IN3 and OUT0–OUT3, respectively, each of the switch transistors 1002, 1004, 1006, and 1008 being driven at its gate by a lowest level enable signal EN. Inputs IN0–IN63 are coupled to NAND gates 843–858 as shown in FIGS. 8B and 8C for producing lowest level quadrant detect signals at nodes SQD000–SQD0003, SQD0010–SQD0013, SQD0020–SQD0023, and SQD0030–SQD0033, which are in turn coupled to inverters 859–874 having outputs at NAND gates 891–894, as shown in FIGS. 8B and 8C, for producing second-lowest-level quadrant detect signals at nodes SQD000–SDQ003. Using a circuit configuration to be described further infra, the signals at nodes SQD000–SQD003 are combined in a manner which produces the logical OR of the signals SQD000–SQD003 at the output of a NAND gate 835 at a node SQD00, as shown in FIG. ??8C. The signal present at node SQD00 is a subquadrant detect signal which is driven high responsive to the activation of at least one of the input lines IN0–IN63. The node SQD00 is coupled to a first current node of an n-channel switch transistor 899d, which has a second current node coupled to the A7A6__EXT node of subquadrant circuit SQ00 and a gate coupled to the A9A8__EXT node of subquadrant circuit SQ0. Accordingly, the node SQD00 remains isolated from node A7A6__EXT when A9A8__EXT is low, and is coupled to node A7A6__EXT when A9A8__

EXT is driven high. It is to be appreciated that subquadrant circuits SQ01–SQ03 generate their respective quadrant detect signals at nodes SQD01, SQD02, and SQD03 in a like manner as subquadrant circuit SQD00.

Given the above described circuit configuration, the truth table associated with A7A6__SEL circuit 650 of quadrant Q0 is as follows:

TABLE 3

Truth Table for A7A6__SEL Circuit 650

| SQD | | | | B98__IN | A9A8EXT | | | | A7A6EXT | | | |
|---|---|---|---|---|---|---|---|---|---|---|---|---|
| 00 | 01 | 02 | 03 | | 0 | 1 | 2 | 3 | 0 | 1 | 2 | 3 |
| 1 | X | X | X | 1 | 1 | 0 | 0 | 0 | 1 | H | H | H |
| 0 | 1 | X | X | 1 | 1 | 1 | 0 | 0 | 0 | 1 | H | H |
| 0 | 0 | 1 | X | 1 | 1 | 1 | 1 | 0 | 0 | 0 | 1 | H |
| 0 | 0 | 0 | 1 | 1 | 1 | 1 | 1 | 1 | 0 | 0 | 0 | 1 |
| 0 | 0 | 0 | 0 | 0 | 0 | 0 | 0 | 0 | H | H | H | H |

(X = don't care)
(H = high impedance state)

As shown by the above truth table, A7A6EXT0 is driven high when at least one of the inputs IN0–IN63 is active, and A7A6EXT1–3 are driven to high impedance states. As further shown in FIG. 6C, the node A7A6EXT0 output of A7A6__SEL circuit 650 is coupled to the member A7BA6B of bus member BG76. As dictated by Table 1 above, the conversion circuit 612 will ensure that the output bits are driven to A7=0 and A6=0, as desired.

If all of input lines IN0–IN63 are inactive, while at least one of input lines IN64–IN127 is active, thus causing SQD00 to be low and SQD01 to be high, A7A6__SEL circuit 650 will drive A7A6EXT0=0 and A7A6EXT1=1. The node A7A6EXT1 is coupled to member A7BA6 of bus group BG76, and thus the conversion circuit 612 will drive the output lines to A7=0 and A6=1, as desired.

If all of input lines IN0–127 are inactive, while at least one of input lines IN128–IN191 is active, thus causing SQD00 and SQD01 to be low and SQ02 to be high, A7A6__SEL circuit 650 will drive A7A6EXT0=0, A7A6EXT1=0, and A7A6EXT2=1. The node A7A6EXT2 is coupled to member A7A6B of bus group BG76, and thus the conversion circuit 612 will drive the output lines to A7=1 and A6=0, as desired.

If all of input lines IN0–191 are inactive, while at least one of input lines IN192–255 is active, thus causing SQD00, SQD01, and SQD02 to be low and SQD03 to be high, A7A6__SEL circuit 650 will drive A7A6EXT0=0, A7A6EXT1=0, A7A6EXT2=0, and A7A6EXT3=1. The node A7A6EXT3 is coupled to member A7A6 of bus group BG76, and thus the conversion circuit 612 will drive the output lines to A7=1 and A6=1, as desired.

Finally, if none of the input lines IN0–255 are active, driving all of SQD00–SQD03 to low, the input BG98__IN of A7A6SEL circuit 650 will be 0. This causes each of A7A6EXT0–3 to simply represent a high impedance to the members of bus group BG76. This is the desired characteristic, because if none of the input lines in the quadrant Q0 is active, then none of the subquadrant circuits SQ00–SQ03 should participate in the determination of address lines A7 and A6.

The operation and structure of priority encoder 600 with respect to bus group BG54 is now described. It is noted that only the operation and structure of subquadrant circuit SQ00 will be discussed, since the structures of quadrants SQ01, SQ02, and SQ03 are advantageously identical with respect to the driving of bus groups BG54, BG32, and BG10 as the subquadrant circuit SQ00. Referring now to FIGS. ??8A–8E, subquadrant circuit SQ00 generates a sub-subquadrant, or second-lowest quadrant, detect signal at node SQD000 for indicating the presence of at least one active input line in the range IN0–IN15, a second-lowest quadrant detect signal at node SQD001 for indicating the presence of at least one active input line in the range IN16–IN31, a second-lowest quadrant detect signal at node SQD002 for indicating the presence of at least one active input line in the range IN32–IN47, and a second-lowest quadrant detect signal at node SQD003 for indicating the presence of at least one active input line in the range IN48–IN63, as discussed previously. It is noted here that the terms "second-lowest quadrant detect signal" and "sub-subquadrant detect signal" are interchangeable for a 1024-input priority encoder, both indicating a consecutive region of 16 input lines.

As shown in FIG. ??8B, node SQD000 is coupled to an inverter 817, the output of inverter 817 being coupled to the input of an inverter 818 and to a first input of each of NAND gates 819, 822, and 823. Inverter 818 has an output coupled to a first current node of an n-channel switch transistor 897 and to an input of an inverter 896, inverter 896 having an output coupled to a first input of the NAND gate 835. Node SQD001 is coupled to a second input of the NAND gate 819 and to the input of an inverter 821, the inverter 821 having an output coupled to second inputs of each of the NAND gates 822 and 823. The NAND gate 819 has an output coupled to the input of an inverter 820, the inverter 820 having an output coupled to a first current node of an n-channel switch transistor 899a and to an input of an inverter 898, inverter 898 having an output coupled to a second input of the NAND gate 835. Node SQD002 is coupled to a third input of the NAND gate 822 and to the input of an inverter 822a, the inverter 822a having an output coupled to a third input the NAND gates 823. The NAND gate 822 has an output coupled to the input of an inverter 820a, the inverter 820a having an output coupled to a first current node of an n-channel switch transistor 834 and to an input of an inverter 825, inverter 898 having an output coupled to a third input of the NAND gate 835. Node SQD003 is coupled to a fourth input of the NAND gate 823, the NAND gate 823 having an output coupled to the input of an inverter 824, the inverter 824 having an output coupled to a first current node of an n-channel switch transistor 828 and to an input of an inverter 827, inverter 827 having an output coupled to a fourth input of the NAND gate 835.

As shown in FIG. ??8C, a NAND gate 839 and an inverter 899b are coupled between the inputs A9A8_EXT and A7A6_EXT and a gate of switch transistor 897, the switch transistor 897 having a second current node coupled to member A5BA4B of bus group BG54. A NAND gate 837 has a first input coupled to A9A8_EXT, a second input coupled to A7A6_EXT, and a third input coupled to the output of an inverter 899f, the inverter 899f having an input coupled to the member A5BA4B of the bus group BG54. NAND gate 837 has an output coupled to the input of an inverter 899c, the inverter 899c having an output coupled to the gate of switch transistor 899a, the switch transistor 899a having a second current node coupled to member A5BA4 of bus group BG54. A NAND gate 831 has a first input coupled to A9A8_EXT, a second input coupled to A7A6_EXT, a third input coupled to the output of an inverter 831b, the inverter 831b having an input coupled to the member A5BA4B of the bus group BG54, and a fourth input coupled to the output of an inverter 831a, the inverter 831a having an input coupled to the member A5BA4 of the bus group BG54. NAND gate 831 has an output coupled to the input of an inverter 829, the inverter 829 having an output coupled to the gate of switch transistor 834, the switch transistor 834 having a second current node coupled to member A5A4B of bus group BG54. A NAND gate 834a has a first input coupled to A9A8_EXT, a second input coupled to A7A6_EXT, a third input coupled to the output of an inverter 832c, the inverter 832c having an input coupled to the member A5BA4B of the bus group BG54, a fourth input coupled to the output of an inverter 832b, the inverter 832b having an input coupled to the member A5BA4 of the bus group BG54, and a fifth input coupled to the output of an inverter 832a, the inverter 832a having an input coupled to member A5A4B of the bus group BG54. NAND gate 834a has an output coupled to the input of an inverter 830, the inverter 830 having an output coupled to the gate of switch transistor 828, the switch transistor 828 having a second current node coupled to member A5A4 of bus group BG54.

The above structure results in the following truth table for the subquadrant circuit SQ00 with respect to bus group BG54:

TABLE 4

Truth Table for Subquadrant Circuit SQ00 / A7A6_SEL Circuit 650

| A9A8_EXT | A7A6_EXT | SQD 000 | 001 | 002 | 003 | A5BA4B | A5BA4 | A5A4B | A5A4 |
|---|---|---|---|---|---|---|---|---|---|
| 0 | H | X | X | X | X | H | H | H | H |
| 1 | 0 | X | X | X | X | H | H | H | H |
| 1 | 1 | 1 | X | X | X | 1 | H | H | H |
| 1 | 1 | 0 | 1 | X | X | 0 | 1 | H | H |
| 1 | 1 | 0 | 0 | 1 | X | 0 | 0 | 1 | H |
| 1 | 1 | 0 | 0 | 0 | 1 | 0 | 0 | 0 | 1 |

(X = don't care)
(H = high impedance state)

As shown by the above truth table, when either or both of A9A8_EXT or A7A6_EXT are low, indicating that the 64 input lines corresponding to the subquadrant circuit in question do not correspond to the lowest-addressed set of 64 input lines having at least one input line in the active state, the subquadrant circuit leaves the members of bus group BG54 in a high impedance state. This is the desired result, as the bus group BG54 is to be driven by a different subquadrant circuit in this circumstance.

When both A9A8__EXT and A7A6__EXT are high, the subquadrant circuit drives the bus group BG54 for determining the values of output lines A5 and A4. As shown in FIG. ??6A, the members of bus group BG54 are coupled to the inputs of conversion circuit 614, the conversion circuit 614 having a truth table as shown in Table 1. Tables 1 and 4 show that output lines A5 and A4 are driven to the appropriate values by the subquadrant circuit is enabled, i.e. when both A9A8T__EXT and A7A6__EXT are high.

The operation and structure of priority encoder 600 with respect to bus groups BG32 and BG10 is now described. Referring now to FIGS. ??8A, 8D and 8E, subquadrant circuit SQ00 comprises NAND gates 841, 895, 833, and 826 each having first and second inputs coupled to A9A8__EXT and A7A6__EXT, respectively. NAND gate 841 has a third input coupled to the member A5BA4B of bus group BG54 and an output coupled to a node F000, NAND gate 895 has a third input coupled to the member A5BA4 and an output coupled to a node F001, NAND gate 833 has a third input coupled to the member A5A4B and an output coupled to a node F002, and NAND gate 895 has a third input coupled to the member A5A4 and an output coupled to a node F003. When either A9A8__EXT or A7A6__EXT are low, indicating that the subquadrant is not participating in the driving of bus groups BG54 and lower, all of nodes F000–F003 are high.

When both A9A8__EXT and A7A6__EXT are high, indicating that the subquadrant participates in the driving of bus groups BG54 and below, node F000 is low when member A5BA4B is high, i.e., when at least one request line among IN00–IN15 is active, and low otherwise. Node F001 is low when member A5BA4 is high, i.e. when at least one of input lines IN16–31 is active while none of IN00–15 is active, and high otherwise. Node F002 is low when member A5A4B is high, i.e. when at least one of input lines IN32–47 is active while none of IN00–31 is active, and high otherwise. Finally, node F003 is low when member A5A4 is high, i.e. when at least one of input lines IN48–63 is active while none of IN00–47 is active, and high otherwise.

Subquadrant circuit SQ00 comprises a sel__1234 circuit 836 associated with input lines IN00–15, a sel__1234 circuit 838 associated with input lines IN16–31, a sel__1234 circuit 840 associated with input lines IN32–47, and a sel__1234 circuit 842 associated with input lines IN48–63. The sel__1234 circuits 836, 838, 840, and 842 each comprise an active-low CRNT0 input for receiving an active-low enable signal. The CRNT0 nodes of sel__1234 circuits 836, 838, 840, and 842 are coupled to nodes F000, F001, F002, and F003, respectively. Advantageously, each of the sel__1234 circuits is identical in structure and operation to sel__1234 circuit 836 for generating signals associated with the driving of bus groups BG32 and BG10, and therefore only sel__1234 circuit 836 is described.

In general, when viewed as a whole, the elements 801–804, 843–846, 859–862, 875–878, and 836 operate in a manner similar to the priority encoder 300 of FIG. 3 for driving the bus groups BG32 and BG10, except that the internally-generated active-high signal RD of priority encoder 300 is replaced by the externally provided active-low signal CRTN0. This difference exists because the priority encoder 300 will always drive the values of bus groups BG32 and BG10 because it is a 16-input encoder, and thus the signal RD, which is the logical OR of all input lines, serves an the appropriate enable signal. In contrast, the elements above are part of a larger priority encoder and will only drive bus groups BG32 and BG10 if their associated range of inputs lines is the lowest-addressed group of 16 lines having an active member. As disclosed previously, this signal is provided to node CNTR0 by higher order circuitry.

Figure 8E:
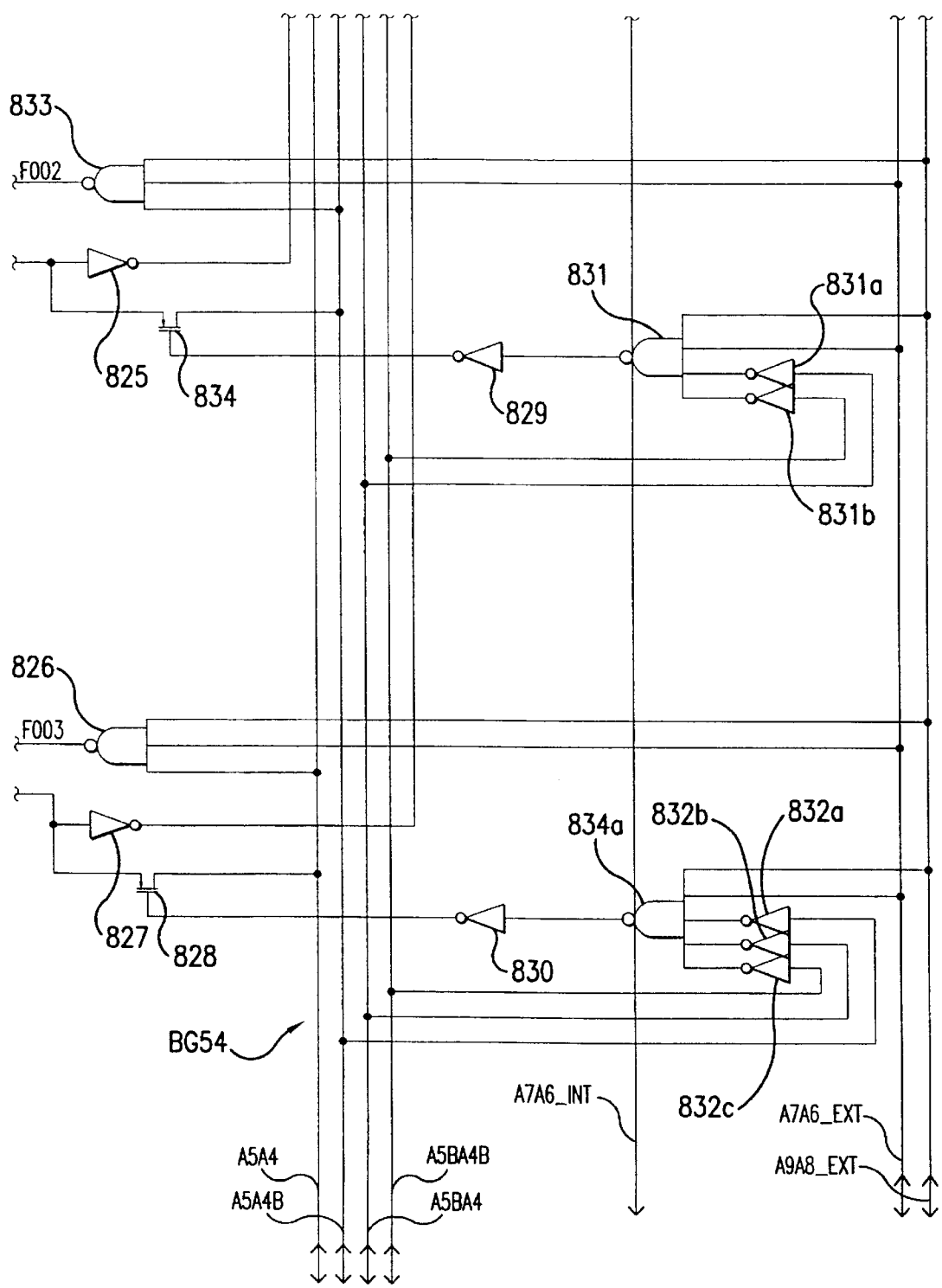

As shown in FIGS. 8B and 8E, sel__1234 circuit 836 comprises inputs IN0–IN3 coupled to nodes SQD0000–SQD0003, respectively. Sel__1234 circuit 836 further comprises an input CRNT1 coupled to member A3BA2B of bus group BG32, an input CRNT2 coupled to member A3BA2, and an input CRNT3 coupled to member A3A2B. Sel__1234 circuit 836 further comprises outputs OUT0–OUT3 coupled respectively to the gates of n-channel switch transistors 883–886, the n-channel switch transistors 883–886 having second current nodes coupled respectively to members A3BA2B, A3BA2, A3A2B, and A3A2 of bus group BG32. Finally, sel__1234 circuit 836 comprises outputs INOUT0–3 for coupling to the enable inputs EN of each of the lowest level circuits 801.

Figure 9:
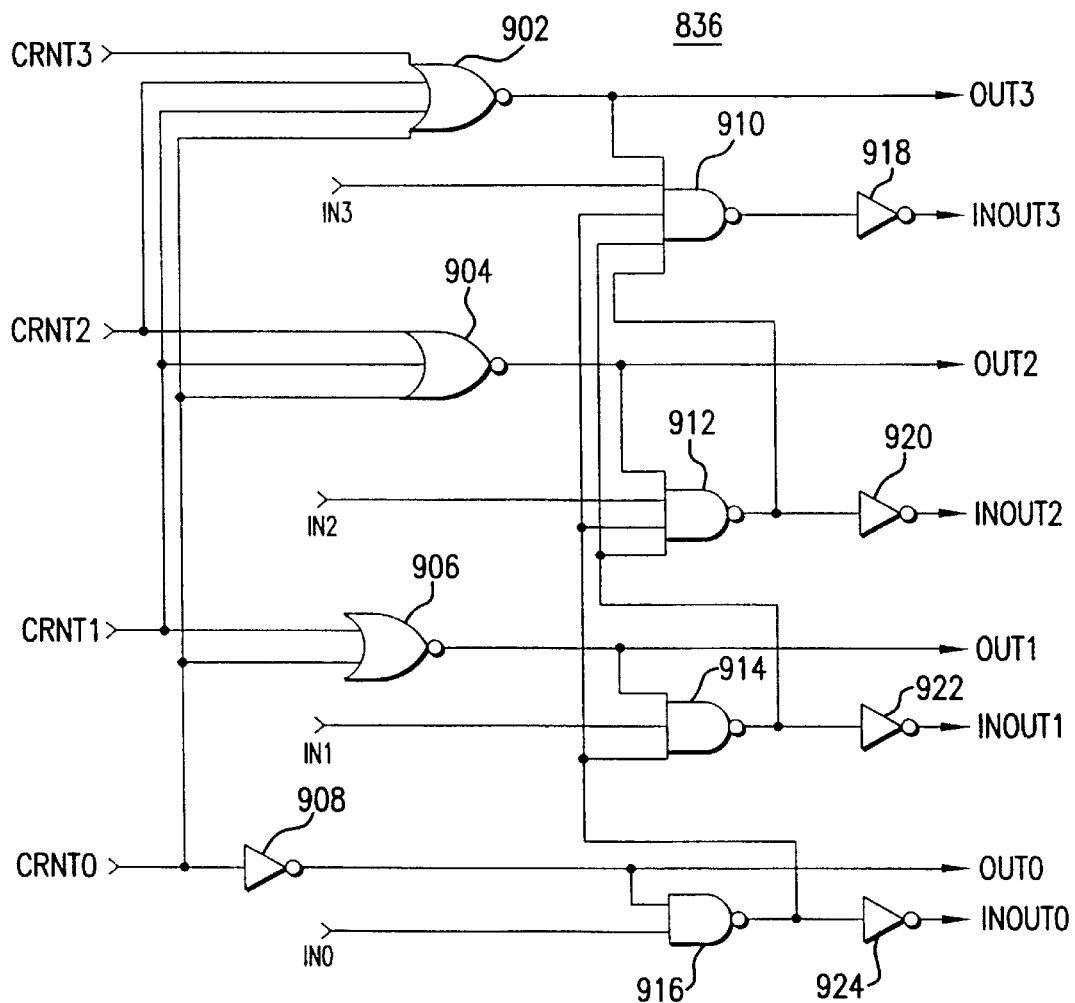
FIG. 9 shows a portion of a second lowest order circuit of the priority encoder of FIG. 6A.

FIG. 9 shows sel__1234 circuit 836 in detail. Sel__1234 circuit 836 comprises inverter 908, NOR gates 902–906, NAND gates 910–916, and inverters 918–924 coupled as shown in FIG. 9 to nodes CRNT0–3, IN0–3, OUT0–3, and INPUT0–3. The sel__1234 circuit 836 as described above yields the following truth table:

TABLE 5

Truth Table for sel__1234 circuit 836

| CRNT0 | IN__SQD000__ | | | | OUT__ | | | | INOUT__EN__ | | | | CRNT1 | CRNT2 | CRNT3 |
|---|---|---|---|---|---|---|---|---|---|---|---|---|---|---|---|
| F000 | 0 | 1 | 2 | 3 | 0 | 1 | 2 | 3 | 0 | 1 | 2 | 3 | A3BA2B | A3BA2 | A3A2B | A3A2 |
| 1 | X | X | X | X | 0 | 0 | 0 | 0 | 0 | 0 | 0 | 0 | H | H | H | H |
| 0 | 1 | X | X | X | 1 | 0 | 0 | 0 | 1 | 0 | 0 | 0 | 1 | H | H | H |
| 0 | 0 | 1 | X | X | 1 | 1 | 0 | 0 | 0 | 1 | 0 | 0 | 0 | 1 | H | H |
| 0 | 0 | 0 | 1 | X | 1 | 1 | 1 | 0 | 0 | 0 | 1 | 0 | 0 | 0 | 1 | H |
| 0 | 0 | 0 | 0 | 1 | 1 | 1 | 1 | 1 | 0 | 0 | 0 | 1 | 0 | 0 | 0 | 1 |

(X = don't care)
(H = high impedance state)

As shown by the above truth table, when CRNT0 is high, indicating that the 16 input lines corresponding to the sel__1234 circuit in question do not correspond to the lowest-addressed set of 16 input lines having at least one input line in the active state, the members of bus group BG32 are left in a high impedance state. This is the desired result, as the bus group BG32 is to be driven by a circuitry associated with a different sel__1234 circuit in this circumstance.

When CRNT0 is low, the circuitry associated with the sel__1234 circuit drives the bus group BG32 for determining the values of output lines A3 and A2. As shown in FIG. 6, the members of bus group BG32 are coupled to the inputs of conversion circuit 616, the conversion circuit 616 having a truth table as shown in Table 1. Tables 1 and 5 show that output lines A3 and A2 are driven to the appropriate values when CRNT0 is low.

The INOUT0–INOUT3 outputs of sel__1234 circuits are coupled to the enable inputs EN of each of the lowest level driver circuits 801–804, as shown in FIG. 8A. Advantageously, the lowest level driver circuits 802–804 are identical to the lowest level driver circuit 801, and only lowest level driver circuit 801 is described. FIG. 10 shows the lowest level driver circuit 801, which comprises the n-channel switch transistors 1002, 1004, 1006, and 1008 as shown in FIG. 10 and having the following truth table.

TABLE 6

Truth Table for lowest level driver circuit 801

| EN | \_\_\_\_IN\_\_\_\_ | | | | OUT0 | OUT1 | OUT2 | OUT3 |
|----|---|---|---|---|------|------|------|------|
|    | 0 | 1 | 2 | 3 | A1BA0B | A1BA0 | A1A0B | A1A0 |
| 0 | X | X | X | X | H | H | H | H |
| 1 | 0 | X | X | X | 0 | X | X | X |
| 1 | 1 | 0 | X | X | 1 | 0 | X | X |
| 1 | 1 | 1 | 0 | X | 1 | 1 | 0 | X |
| 1 | 1 | 1 | 1 | 0 | 1 | 1 | 1 | 0 |

(X = don't care)
(H = high impedance state)

As shown by the above truth table, when EN is low, indicating that the 4 input lines corresponding to the lowest level driver circuit in question do not correspond to the lowest-addressed set of 4 active-low input lines having at least one input line in the active state, the members of bus group BG10 are left in a high impedance state. This is the desired result, as the bus group BG10 is to be driven by a circuitry associated with a different lowest level driver circuit in this circumstance.

When EN is high, the lowest level driver circuit 801 drives the bus group BG10 for determining the values of output lines A1 and A0. As shown in FIG. 6D, the members of bus group BG10 are coupled to the inputs of conversion circuit 618, the conversion circuit 618 having a truth table as shown in Table 1. Tables 1 and 6 show that output lines A1 and A0 are driven to the appropriate values when EN is enabled.

It is apparent that many modifications and variations of the preferred embodiment as set forth here may be made without departing from the spirit and scope thereof. For example, while a priority encoder according to the preferred embodiment has been disclosed in the context of a CAM, it is readily apparent that priority encoders according to the preferred embodiment may be used in a variety of digital circuit applications in which the address of a highest priority active input request line is required. As another example, the priority encoder is easily modified for a priority scheme wherein each higher-address request line has a higher priority than each lower-address request line. This modification could be achieved by simply reversing the successive enablement schemes associated with each of the bus groups, and by modifying the truth table of the bus group conversion circuits to generate two address bits corresponding to the active member associated with the highest quadrant of addresses, instead of the lowest quadrant of addresses. Thus, the specific embodiments described here and above are given by way of example only and the invention is limited only by the terms of the appended claims.

What is claimed is:

1. A priority encoder for coupling to a plurality of request lines, said request lines each having an active state and an inactive state and having a relative priority, said priority encoder for detecting an active state of at least one of said request lines and providing an address of a highest priority active request line, said priority encoder comprising:

a plurality of input lines for receiving signals corresponding to the state of said request lines, said plurality of input lines including a first subset of input lines, said first subset of input lines including a first input line;

a plurality of output lines for providing the address of the highest priority active request line, said plurality of output lines including a higher order bit line and a lower order bit line;

an upper logic circuit for driving said higher order bit line, said upper logic circuit having an input coupled to said first input line and an output coupled to said higher order bit line;

a lower logic circuit for driving said lower order bit line, said lower logic circuit having an output coupled to said lower order bit line; and a feedback switch circuit coupled between said first input line and said lower logic circuit for selectively coupling said first input line to an input of said lower logic circuit responsive to a feedback signal provided by said upper logic circuit;

wherein said feedback switch circuit couples said first input line to said lower logic circuit input when at least one of the request lines is active and when said first subset of input lines corresponds to a highest priority activated subset as determined by said upper logic circuit, and wherein said feedback switch circuit isolates said first input line from said lower logic circuit input when said first subset of input lines does not correspond to said highest priority activated subset;

whereby said first input line only participates in the determination of said lower order bit upon being within said highest priority activated subset.

2. The priority encoder of claim 1, said upper logic circuit comprising:

a first bus group corresponding to a plurality of consecutive output lines including said higher order bit line and having a number of members equal to the number of possible states of said consecutive output lines, each member representing a unique one of said possible states and being active for indicating said state, said members having a relative priority;

a first bus group driver circuit coupled between said input lines and said first bus group for activating a highest priority member responsive to the address of the highest priority active request line; and a converter coupled between said first bus group and said plurality of consecutive output lines for driving said plurality of output lines to a state corresponding to said highest priority active member.

3. The priority encoder of claim 2, the request lines having sequential addresses, the relative priority of each lower address request line having a higher priority each higher address request line.

4. The priority encoder of claim 3, each of said members of said first bus group corresponding to a unique range of request line addresses, the relative priority of said members corresponding to the relative priority of their respective ranges of request line addresses.

5. The priority encoder of claim 4, further comprising:

a first bus group control node for receiving a first bus group control signal;

a first bus group OR circuit for detecting an active state of a request line corresponding to any of said members of said first bus group and for activating said first bus group control signal responsive thereto;

a first member corresponding to a highest priority range of request line addresses;

a first member detect node for receiving a first member detect signal;

a first member OR circuit for detecting an active state of a request line corresponding to said first member and for activating said first member detect signal responsive thereto;

a first member forward switch circuit for connecting said first member detect node to said first member responsive to the activation of said first bus group control signal;

wherein said first member (a) is coupled to an active signal when a request line corresponding to said first member is activated, (b) is coupled to an inactive signal when a request line corresponding to a different of said members of said first bus group is activated, and (c) remains isolated from said first member control node when no request line corresponding to any of said members of said first bus group is activated.

6. The priority encoder of claim 5, further comprising:

a second member corresponding to a second highest priority range of request line addresses;

a second member detect node for receiving a second member detect signal;

a second member OR circuit for detecting an active state of a request line corresponding to said second member and for activating said second member detect node responsive thereto;

a second member forward switch circuit for connecting said second member detect node to said second member upon the activation of said first bus group control signal together with the deactivation of said first member;

wherein said second member (a) remains isolated from said second member detect node when no request line corresponding to any of said members of said first bus group is activated, (b) remains isolated from said second member detect node when a request line corresponding to said first member is activated, (c) is coupled to an active signal when a request line corresponding to said second member is activated and when no request line corresponding to said first member is activated, and (d) is coupled to an inactive signal when a request line corresponding to a different member than said first or second members of said first bus group is activated.

7. The priority encoder of claim 6, said first member forward switch circuit comprising a transistor having a first current node coupled to said first member detect node, a second current node coupled to said first member, and a control node coupled to the first bus group control node.

8. The priority encoder of claim 7, said second member forward switch circuit comprising:

a transistor having a first current node coupled to said second member candidate node, a second current node coupled to said second member, and a control node;

a logic circuit for driving said control node with the logical AND of said first bus group control signal and the inverse of the logical value of said first member.

9. The priority encoder of claim 8, said lower logic circuit comprising:

a second bus group corresponding to a plurality of consecutive output lines including said lower order bit line and having a number of members equal to the number of possible states of said consecutive output lines, each member representing a unique one of said possible states and being active for indicating said state, said members having a relative priority;

a converter coupled between said first bus group and said plurality of consecutive output lines for driving said plurality of output lines to a state corresponding to a highest priority active member of said bus group.

10. The priority encoder of claim 9, said feedback switch circuit comprising:

a first member feedback switch circuit for selectively coupling the request lines corresponding to said first member of said first bus group to said second bus group responsive to a signal at a first feedback node;

a second member feedback switch circuit for selectively coupling the request lines corresponding to said second member of said first bus group to said second bus group responsive to a signal at a second feedback node;

a first direct connection between said first member feedback node and said control node of said transistor of said first member forward switch circuit;

a second direct connection between said second member feedback node and said control node of said transistor of said second member forward switch circuit.

11. A priority encoder for receiving request signals from a plurality of input request lines having sequential addresses and for providing an output code word equal to the address of the active request signal having the lowest address, comprising:

a plurality of output lines for providing said lowest address;

a first circuit for driving a plurality of higher order output lines responsive to said request signals, said higher order output lines corresponding to higher order bits of said lowest address;

a second circuit for driving a plurality of lower order output lines, said lower order output lines corresponding to lower order bits of said lowest address, said second circuit being electrically isolated from said input request lines when deactivated, said second circuit being coupled to a plurality of said input request lines when activated; and a switch circuit for activating said second circuit responsive to a feedback signal provided by said first circuit;

wherein said second circuit determines said lower order output lines when said switch circuit receives said feedback signal provided by said first circuit;

and wherein said priority encoder provides said lowest address using combinatorial logic elements not including clocks or delay elements.

12. The priority encoder of claim 11, said switch circuit comprising a switch transistor having a first current node coupled to a one of said input request lines, a second current node coupled to said second switch circuit, and a control node coupled to said first circuit.

13. A priority encoder for receiving $2^N$ request signals from $2^N$ input request lines having sequential addresses and for providing an N-bit output code word equal to the address of the active request signal having the lowest address, comprising:

N output lines for providing said N-bit output code word;

N/2 bus groups, each bus group comprising 4 members for driving two adjacent output lines, each of said 4 members representing a possible state of said two adjacent output lines and being active for indicating said state, said N/2 bus groups being arranged from a highest order bus group for driving the highest two bits of said N-bit output code word to a lowest order bus group for driving the lowest two bits of said N-bit output code word;

N/2 converter circuits for driving said two adjacent output lines associated with each of said N/2 bus groups responsive to the state of said bus group for providing 2 bits of said N-bit output code word;

N/2 logic circuits, each respectively associated with a one of said N/2 bus groups, for driving said bus group, said N/2 logic circuits being arranged from a highest order logic circuit associated with said highest order bus group to a lowest order logic circuit associated with a lowest order bus group; and means for combinatorially providing an enable signal to each lower order logic circuit with signals provided by each higher order bus group, wherein said priority encoder is configured to sequentially produce said lowest address in order from said highest order bits to said lowest order bits without the use of delay elements.

14. The priority encoder of claim 13, wherein said highest order logic circuit comprises:

a first combinatorial logic circuit for providing a logical OR of all request lines at a request detect node for providing a request detect signal;

a second combinatorial logic circuit for providing a logical OR of each of four sequential quadrants of request lines for providing four quadrant detect signals;

means for driving said highest bus group responsive to said request detect signal and said four quadrant detect signals for determining the highest two bits of said N-bit output code word.

15. The priority encoder of claim 14, further comprising a second-highest order logic circuit for driving said second-highest order bus group, comprising:

four subcircuits corresponding respectively to each of said four sequential quadrants of request lines, each subcircuit being configured to receive an enable signal from said highest order logic circuit;

a third combinatorial logic circuit for providing a logical OR of each of sixteen subquadrants of request lines for providing sixteen subquadrant detect signals;

wherein said subcircuits are each associated with four adjacent, nonoverlapping subquadrant detect signals;

wherein each subcircuit is configured to drive said second-highest order bus group responsive to its respective enable signal and its four respective subquadrant detect signals;

wherein said highest order logic circuit provides an enable signal only to the subcircuit corresponding to the quadrant detect signal corresponding to the lowest address quadrant;

wherein said second-highest bus group is driven by that subcircuit of said second-highest logic circuit corresponding to a one of the four quadrants of request lines containing the lowest address active request line.

16. The priority encoder of claim 15, said subcircuits comprising switch transistors.

17. The priority encoder of claim 16, each of said switch transistors comprising:

a first current node coupled to a member of said second-highest bus group;

a second current node coupled to a one of said four respective subquadrant detect signals; and a control node coupled to said subcircuit enable signal.

18. A priority encoder for receiving $2^N$ request signals from $2^N$ input request lines and for providing an N-bit output code word equal to the address of a highest priority active request signal, comprising:

$2^N$ input nodes for receiving the $2^N$ request lines;

N output lines for providing said N-bit output code word, said N-bit output code word comprising a first address bit and a second address bit;

a first circuit for generating said first address bit;

a second circuit for generating said second address bit; and a feedback circuit for providing a feedback signal from said first circuit to said second circuit, wherein said second address bit depends at least in part on the value of said feedback signal;

wherein said priority encoder is configured to generate said N-bit outout code word without the use of delay elements or clock signals.

19. The priority encoder of claim 18, said priority encoder having a response time between a first time when all request lines are valid and a second time when said output code word is valid, wherein N is greater than or equal to 6, and wherein said response time is less than 20 ns.

20. The priority encoder of claim 19, wherein N is greater than or equal to 8.

21. The priority encoder of claim 20, wherein N is greater than or equal to 10.

22. The priority encoder of claim 18, wherein said first address bit is a more significant bit than said second address bit.

* * * * *